US012625430B2

(12) United States Patent
Kim et al.

(10) Patent No.: US 12,625,430 B2
(45) Date of Patent: May 12, 2026

(54) COLORED PHOTOSENSITIVE RESIN COMPOSITION AND MUTILAYER CURED FILM PREPARED THEREFROM

(71) Applicant: ROHM AND HAAS ELECTRONIC MATERIALS KOREA LTD., Chungcheongnam-do (KR)

(72) Inventors: Seung-Keun Kim, Gyeonggi-do (KR); Kyung-Jae Park, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

(21) Appl. No.: 18/508,781

(22) Filed: Nov. 14, 2023

(65) Prior Publication Data

US 2024/0085791 A1 Mar. 14, 2024

Related U.S. Application Data

(62) Division of application No. 17/529,008, filed on Nov. 17, 2021, now abandoned.

(30) Foreign Application Priority Data

Nov. 24, 2020 (KR) ........................ 10-2020-0159138
Sep. 30, 2021 (KR) ........................ 10-2021-0129605

(51) Int. Cl.
*G03F 7/039* (2006.01)
*G03F 7/004* (2006.01)
(Continued)

(52) U.S. Cl.
CPC .......... *G03F 7/0392* (2013.01); *G03F 7/0045* (2013.01); *G03F 7/162* (2013.01);
(Continued)

(58) Field of Classification Search
CPC ...... G03F 7/0392; G03F 7/0045; G03F 7/033; G03F 7/105; G03F 7/004; G03F 7/027
See application file for complete search history.

(56) References Cited

U.S. PATENT DOCUMENTS

| | | | | |
|---|---|---|---|---|
| 2016/0161847 | A1* | 6/2016 | Araki | G03F 7/0035 430/7 |
| 2018/0210280 | A1* | 7/2018 | Chen | H10K 59/00 |
| 2020/0399484 | A1 | 12/2020 | Yoo et al. | |

FOREIGN PATENT DOCUMENTS

| | | |
|---|---|---|
| JP | 2001154206 A | 6/2001 |
| KR | 20150090497 A | 8/2015 |

OTHER PUBLICATIONS

Request for the Submission of an Opinion from Korea Intellectual Property Office, Application No. 10-2021-0129605, Filing Date: Sep. 30, 2021.

(Continued)

*Primary Examiner* — Jonathan Johnson
*Assistant Examiner* — Alexander N. Lee
(74) *Attorney, Agent, or Firm* — G. Creston Campbell

(57) ABSTRACT

The colored photosensitive resin composition of the present invention maintains excellent resolution, visibility, and the like while it has excellent reflectance $R_{SCI}$ measured by the SCI (specular component included) method, reflectance $R_{SCE}$ measured by the SCE (specular component excluded) method, and the ratio between them ($R_{SCE}/R_{SCI}$), and has a uniform film thickness in an appropriate range. Thus, it can be formed into a multilayer cured film that simultaneously satisfies such physical properties as a high reflectance and a high light-shielding property. In addition, when a cured film is formed from the composition, it is possible to form a pattern on a multilayer film in a single development process. Thus, it can be advantageously used for a quantum dot display device.

6 Claims, 3 Drawing Sheets

(51) Int. Cl.
*G03F 7/16* (2006.01)
*G03F 7/18* (2006.01)
*G03F 7/20* (2006.01)
*G03F 7/32* (2006.01)
*G03F 7/38* (2006.01)
*G03F 7/40* (2006.01)

(52) U.S. Cl.
CPC ................ *G03F 7/168* (2013.01); *G03F 7/18* (2013.01); *G03F 7/2006* (2013.01); *G03F 7/322* (2013.01); *G03F 7/38* (2013.01); *G03F 7/40* (2013.01)

(56) References Cited

OTHER PUBLICATIONS

Search Report from Taiwan Intellectual Property Office, Application No. 110143139, Filing Date: Nov. 19, 2021.

* cited by examiner

COLORED PHOTOSENSITIVE RESIN COMPOSITION AND MUTILAYER CURED FILM PREPARED THEREFROM

CLAIM OF BENEFIT OF PRIOR APPLICATION

This is a divisional application of U.S. patent application Ser. No. 17/529,008, filed Nov. 17, 2021, which is the Convention Filing of KR10-2020-0159138, filed Nov. 24, 2020 and KR 10-2021-0129605, filed Sep. 30, 2021, all of which are incorporated by reference herein in their entirety.

TECHNICAL FIELD

The present invention relates to a colored photosensitive resin composition having excellent light-shielding property and reflectance to be applicable as quantum dot barrier ribs and to a multilayer cured film for quantum dot barrier ribs prepared from the composition.

BACKGROUND ART

In recent years, interest in various electronic devices employing quantum dots (QDs) has increased.

Quantum dots are a material that produces an effect of quantum confinement as a nanocrystal of a semiconductor material having a diameter of approximately 10 nm or less. Although they are composed of hundreds of thousands of electrons or more, most electrons are firmly bound to the atomic nucleus, so that the number of free electrons that are not bound is limited to about 1 to 100. In such an event, the energy level of the electrons is discontinuously limited to show electrical and optical characteristics different from those of a semiconductor in a bulk state that forms a continuous band. These quantum dots can produce various colors by generating light wavelengths of different lengths for each particle size even without a change in the material type. Since they have the advantages of high color purity and light safety as compared with conventional light emitters, they are currently used in various fields such as displays, solar cells, biosensors, and lighting, and are drawing attention as a next-generation light emitting device.

FIG. 1 is a schematic view for illustrating a typical quantum dot device. Referring to FIG. 1, the substrate structure (100) of the quantum dot device comprises a transparent substrate (110) and barrier ribs (120) formed to partition the area on the substrate (110). Different quantum dot solutions, that is, a first quantum dot solution (130), a second quantum dot solution (140), and a third quantum dot solution (150) are present in the respective partitioned areas. The first quantum dot solution (130), the second quantum dot solution (140), and the third quantum dot solution (150) are composed of quantum dots having different energy levels. That is, they are configured to have different emission wavelength bands as the size or material of the quantum dots is manipulated.

In general, the barrier ribs (120) among the above may be formed as a cured film from a photosensitive resin composition. The barrier ribs (120) should function as a partition separation (or blocking) so that the compositions of respective colors discharged to the partitioned areas are prevented from being mixed. In addition, they should be capable of preventing deterioration in contrast and color purity caused by light leakage from light sources such as colored OLEDs. Accordingly, in recent years, a cured film having the performance of high reflectance and high light-shielding properties is required.

In addition, in order to be applied to a quantum dot device, it is necessary to accomplish a uniform film and an appropriate film thickness to maintain excellent resolution. For example, if the film is not uniform or the film thickness is too small, it is not suitable for barrier ribs, so that the quantum dot solution may overflow the barrier ribs, resulting in mixing of colors or deterioration in the resolution due to poor color purity. If the film thickness is adjusted by coating a photosensitive resin composition thick and curing it in order to solve this problem, it is difficult to accomplish uniform coating, whereby there is a problem that stains or contamination may be generated.

PRIOR ART DOCUMENT

Patent Document (Patent Document 1) Japanese Patent No. 6318699

DETAILED DESCRIPTION OF THE INVENTION

Technical Problem

An object of the present invention is to provide a colored photosensitive resin composition having a high light-shielding property and a high reflectance while the resolution and pattern characteristics are maintained to be excellent and a multilayer cured film prepared from the same.

Solution to the Problem

The present invention provides a colored photosensitive resin composition, which comprises (A) a copolymer; (B) a photopolymerizable compound; (C) a photopolymerization initiator; and (D) a pigment, wherein when the copolymer (A) comprises a first copolymer (A1), the pigment (D) comprises a white pigment (D1), when the copolymer (A) comprises a second copolymer (A2), the pigment (D) comprises a pigment other than white (D2), the first copolymer (A1) comprises (a1) a structural unit derived from an ethylenically unsaturated carboxylic acid, an ethylenically unsaturated carboxylic anhydride, or a combination thereof; (a2) a structural unit derived from an ethylenically unsaturated compound containing an aromatic ring; (a3) a structural unit derived from an ethylenically unsaturated compound containing an epoxy group; and (a4) a structural unit derived from an ethylenically unsaturated compound different from (a1) to (a3), and the second copolymer (A2) comprises (b1) a structural unit derived from an ethylenically unsaturated carboxylic acid, an ethylenically unsaturated carboxylic anhydride, or a combination thereof; and (b2) a structural unit derived from an ethylenically unsaturated compound containing an epoxy group, and comprises at least one of (b3) a structural unit derived from an ethylenically unsaturated compound containing fluorine; and (b4) a structural unit derived from an ethylenically unsaturated compound different from (b1) to (b3).

In order to achieve another object, the present invention provides a multilayer cured film, which comprises a first cured film formed from a first colored photosensitive resin composition and a second cured film formed from a second colored photosensitive resin composition, wherein the first colored photosensitive resin composition comprises (A1) a first copolymer; (B) a photopolymerizable compound; (C) a photopolymerization initiator; and (D1) a white pigment, the second colored photosensitive resin composition comprises (A2) a second copolymer; (B) a photopolymerizable compound; (C) a photopolymerization initiator; and (D2) a pigment other than white, and multilayer cured film has a total thickness of 6 μm or more.

In order to achieve still another object, the present invention provides a process for preparing a multilayer cured film, which comprises (1) coating a first colored photosensitive resin composition on a substrate and curing it to form a first cured film; (2) coating a second colored photosensitive resin composition on the first cured film and curing it to form a second cured film; and (3) exposing and developing it to form a pattern and then post-baking it, wherein the first colored photosensitive resin composition comprises (A1) a first copolymer; (B) a photopolymerizable compound; (C) a photopolymerization initiator; and (D1) a white pigment, the second colored photosensitive resin composition comprises (A2) a second copolymer; (B) a photopolymerizable compound; (C) a photopolymerization initiator; and (D2) a pigment other than white, and the multilayer cured film has a total thickness of 6 μm or more.

Advantageous Effects of the Invention

The colored photosensitive resin composition of the present invention maintains excellent resolution, visibility, and the like while it has excellent reflectance $R_{SCI}$ measured by the SCI (specular component included) method, reflectance $R_{SCE}$ measured by the SCE (specular component excluded) method, and the ratio between them ($R_{SCE}/R_{SCI}$), and has a uniform film thickness in an appropriate range. Thus, it can be formed into a multilayer cured film that simultaneously satisfies such physical properties as a high reflectance and a high light-shielding property. In addition, when a cured film is formed from the composition, it is possible to form a pattern on a multilayer film in a single development process. Thus, it can be advantageously used for a quantum dot display device.

BEST MODE FOR CARRYING OUT THE INVENTION

Figure 1:
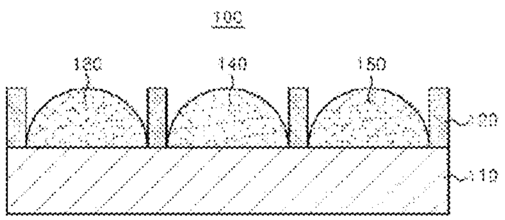
FIG. 1 is a schematic view for illustrating a typical quantum dot device.

The present invention is not limited to those described below. Rather, it can be modified into various forms as long as the gist of the invention is not altered Throughout the present specification, when a part is referred to as "comprising" an element, it is understood that other elements may be comprised, rather than other elements are excluded, unless specifically stated otherwise. In addition, all numbers and expressions relating to quantities of components, reaction conditions, and the like used herein are to be understood as being modified by the term "about" unless specifically stated otherwise.

The present invention provides a colored photosensitive resin composition, which comprises (A) a copolymer; (B) a photopolymerizable compound; (C) a photopolymerization initiator; and (D) a pigment, wherein when the copolymer (A) comprises a first copolymer (A1), the pigment (D) comprises a white pigment (D1), when the copolymer (A) comprises a second copolymer (A2), the pigment (D) comprises a pigment other than white (D2), the first copolymer (A1) comprises (a1) a structural unit derived from an ethylenically unsaturated carboxylic acid, an ethylenically unsaturated carboxylic anhydride, or a combination thereof; (a2) a structural unit derived from an ethylenically unsaturated compound containing an aromatic ring; (a3) a structural unit derived from an ethylenically unsaturated compound containing an epoxy group; and (a4) a structural unit derived from an ethylenically unsaturated compound different from (a1) to (a3), and the second copolymer (A2) comprises (b1) a structural unit derived from an ethylenically unsaturated carboxylic acid, an ethylenically unsaturated carboxylic anhydride, or a combination thereof; and (b2) a structural unit derived from an ethylenically unsaturated compound containing an epoxy group, and comprises at least one of (b3) a structural unit derived from an ethylenically unsaturated compound containing fluorine; and (b4) a structural unit derived from an ethylenically unsaturated compound different from (b1) to (b3).

Specifically, the colored photosensitive resin composition may be a first colored photosensitive resin composition that comprises a first copolymer (A1); a photopolymerizable compound (B); a photopolymerization initiator (C); and a white pigment (D1). In addition, the colored photosensitive resin composition may be a second colored photosensitive resin composition that comprises a second copolymer (A2); a photopolymerizable compound (B); a photopolymerization initiator (C); and a pigment other than white (D2).

First Colored Photosensitive Resin Composition

The first colored photosensitive resin composition may comprise (A1) a first copolymer; (B) a photopolymerizable compound; (C) a photopolymerization initiator; and (D1) a white pigment. It may further comprise (E) a surfactant, (F) an additive such as an epoxy compound, a thiol-based compound, a photobase generator, and an adhesion supplement, and/or (G) a solvent, if necessary.

A first cured film may be formed from the first colored photosensitive resin composition. The first cured film is formed by being coated on a substrate. As it comprises the following components, it may satisfy high reflectance characteristics.

Hereinafter, each component will be described in detail.

Hereinafter, the term "(meth)acryl" refers to "acryl" and/or "methacryl," and the term "(meth)acrylate" refers to "acrylate" and/or "methacrylate."

The weight average molecular weight (g/mole or Da) of each component as described below is measured by gel permeation chromatography (GPC, eluent: tetrahydrofuran) referenced to a polystyrene standard.

(A1) First Copolymer

The first copolymer (A1) comprises (a1) a structural unit derived from an ethylenically unsaturated carboxylic acid, an ethylenically unsaturated carboxylic anhydride, or a combination thereof; (a2) a structural unit derived from an ethylenically unsaturated compound containing an aromatic ring; (a3) a structural unit derived from an ethylenically unsaturated compound containing an epoxy group; and (a4) a structural unit derived from an ethylenically unsaturated compound different from (a1) to (a3).

The first copolymer is an alkali-soluble resin for implementing developability and functions as a binder in the composition. Specifically, as the first copolymer comprises an aromatic ring and an epoxy group in the structure together, a cured film when formed can serve as a base after the composition has been coated and as a structure for implementing the final pattern.

(a1) Structural Unit Derived from an Ethylenically Unsaturated Carboxylic Acid, an Ethylenically Unsaturated Carboxylic Anhydride, or a Combination Thereof The structural unit (a1) may be derived from an ethylenically unsaturated carboxylic acid, an ethylenically unsaturated carboxylic anhydride, or a combination thereof.

The ethylenically unsaturated carboxylic acid and the ethylenically unsaturated carboxylic anhydride may be a polymerizable unsaturated monomer containing at least one carboxyl group in the molecule. Examples thereof may include an unsaturated monocarboxylic acid such as (meth) acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid of trivalence or more and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like.

A structural unit derived from an unsaturated monocarboxylic acid, for example, a structural unit derived from (meth)acrylic acid, among the above is preferable from the viewpoint of developability and polymerizability. The structural unit derived from the above-exemplified compounds may be contained in the copolymer alone or in combination of two or more.

The content of the structural unit (a1) may be 5 to 65% by mole, 10 to 65% by mole, 10 to 50% by mole, 10 to 40% by mole, 10 to 35% by mole, or 15 to 35% by mole, based on the total number of moles of the structural units constituting the first copolymer. Within the above range, it may have favorable developability.

(a2) Structural Unit Derived from an Ethylenically Unsaturated Compound Containing an Aromatic Ring The structural unit (a2) may be derived from an ethylenically unsaturated compound containing an aromatic ring.

Particular examples of the ethylenically unsaturated compound containing an aromatic ring may include phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate; styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing a halogen such as fluorostyrene, chlorostyrene, bromostyrene, and iodostyrene; styrene containing an alkoxy substituent such as methoxystyrene, ethoxystyrene, and propoxystyrene; 4-hydroxystyrene, p-hydroxy-α-methylstyrene, acetylstyrene; and vinyltoluene, divinylbenzene, vinylphenol, o-vinylbenzyl methyl ether, m-vinylbenzyl methyl ether, p-vinylbenzyl methyl ether, o-vinylbenzyl glycidyl ether, m-vinylbenzyl glycidyl ether, p-vinylbenzyl glycidyl ether, and the like.

The structural unit derived from the above-exemplified compounds may be contained in the copolymer alone or in combination of two or more. For polymerizability of the composition, a structural unit derived from styrene-based compounds is preferred among these examples. It is possible to control the reactivity of the first copolymer and to increase the solubility thereof to an aqueous alkaline solution, so that the coatability of the composition can be remarkably enhanced.

The content of the structural unit (a2) may be 1 to 70% by mole, 1 to 60% by mole, 1 to 50% by mole, 1 to 45% by mole, or 3 to 45% by mole, based on the total number of moles of the structural units constituting the first copolymer. Within the above range, it is more advantageous in terms of chemical resistance.

(a3) Structural Unit Derived from an Ethylenically Unsaturated Compound Containing an Epoxy Group The structural unit (a3) may be derived from an ethylenically unsaturated compound containing an epoxy group.

Particular examples of the ethylenically unsaturated compound containing an epoxy group may include glycidyl (meth)acrylate, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth) acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl) acrylamide, N-(4-(2,3-epoxypropoxy)-3,5-dimethylphenylpropyl)acrylamide, 4-hydroxybutyl (meth)acrylate glycidyl ether, 4-hydroxybutyl acrylate glycidyl ether, allyl glycidyl ether, 2-methylallyl glycidyl ether, and the like. The structural unit derived from the above-exemplified compounds may be contained in the copolymer alone or in combination of two or more.

At least one selected from the structural units derived from glycidyl (meth)acrylate, 4-hydroxybutyl acrylate glycidyl ether, and 4-hydroxybutyl (meth)acrylate glycidyl ether among the above is more preferable from the viewpoint of polymerizability and enhancements in the strength of a cured film. Specifically, it enables the formation of a structure through a crosslinking reaction, that is, the formation of a cured film having sufficient film strength. Further, it can impart chemical resistance to the cured film. In addition, it is possible to control the pattern flowability of the composition during curing while maintaining sufficient film strength, thereby enabling the formation of a pattern on the cured film and enhancing the bonding strength with the lower substrate.

The content of the structural unit (a3) may be 1% by mole to 40% by mole, 1% by mole to 30% by mole, 1% by mole to 20% by mole, 1% by mole to 10% by mole, 5% by mole to 30% by mole, 5% by mole to 20% by mole, 5% by mole to 15% by mole, or 5% by mole to 12% by mole, based on the total number of moles of the structural units constituting the first copolymer. Within the above range, it may be more advantageous in terms of residues during the process and margins upon pre-bake.

(a4) Structural Unit Derived from an Ethylenically Unsaturated Compound Different from (a1) to (a3)

The structural unit (a4) may comprise a structural unit derived from an ethylenically unsaturated compound different from (a1) to (a3)

Particular examples of the structural unit derived from an ethylenically unsaturated compound different from the structural units (a-1) to (a-3) may include an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth) acrylate, 3-methoxybutyl (meth)acrylate, ethoxy diethylene glycol (meth)acrylate, methoxy triethylene glycol (meth) acrylate, methoxy tripropylene glycol (meth)acrylate, poly (ethylene glycol) methyl ether (meth)acrylate, trifluoroethyl (meth)acrylate, trifluoro(meth)acrylate, tetrafluoropropyl (meth)acrylate, hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, N-cyclohexylmaleimide, and the like. The structural unit derived from the above-exemplified compounds may be contained in the copolymer alone or in combination of two or more.

At least one of the structural units derived from an unsaturated carboxylic acid ester and a saturated imide, for example, the structural units derived from methyl (meth) acrylate and N-phenylmaleimide, among the above is preferable from the viewpoint of polymerizability and enhancements in the strength of a cured film.

The content of the structural unit (a4) may be 1 to 80% by mole, 10 to 80% by mole, 10 to 70% by mole, 10 to 60% by mole, 10 to 55% by mole, 20 to 50% by mole, or 20 to 55% by mole, based on the total number of moles of the structural units constituting the first copolymer. Within the above range, the storage stability of the composition may be maintained, and the film retention rate may be more advantageously enhanced.

According to an embodiment, examples of the first copolymer having the structural units (a1) to (a4) may include a copolymer of (meth)acrylic acid/styrene/glycidyl (meth) acrylate/methyl (meth)acrylate, a copolymer of (meth) acrylic acid/styrene/4-hydroxybutyl acrylate glycidyl ether/methyl (meth)acrylate, a copolymer of (meth)acrylic acid/styrene/glycidyl (meth)acrylate/N-phenylmaleimide, a copolymer of (meth)acrylic acid/styrene/glycidyl (meth) acrylate/N-cyclohexylmaleimide, and a copolymer of (meth)acrylic acid/styrene/4-hydroxybutyl acrylate glycidyl ether/N-phenylmaleimide.

The first copolymer (A1) may comprise (a1) a structural unit derived from methacrylic acid; (a2) a structural unit derived from styrene; (a3) a structural unit derived from glycidyl methacrylate, 4-hydroxybutyl acrylate glycidyl ether, or a mixture thereof; and (a4) a structural unit derived from methyl methacrylate, N-phenylmaleimide, or a mixture thereof.

The first copolymer may have a weight average molecular weight (Mw) of 4,000 to 20,000 Da, 4,000 to 15,000 Da, 5,000 to 20,000 Da, 5,000 to 15,000 Da, or 10,000 to 15,000 Da. Within the above range, a pattern profile upon development may be favorable, and such properties as film retention rate and chemical resistance may be enhanced.

The first copolymer (A) may be prepared by charging to a reactor monomers capable of deriving the above structural units (a1) to (a4), a radical polymerization initiator, and a solvent, followed by charging nitrogen thereto and slowly stirring the mixture for polymerization.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide, lauryl peroxide, t-butyl peroxypivalate, 1,1-bis(t-butylperoxy)cyclohexane, or the like, but it is not limited thereto. The radical polymerization initiator may be used alone or in combination of two or more.

The solvent may be any conventional solvent commonly used in the preparation of a copolymer and may be, for example, propylene glycol monomethyl ether acetate (PGMEA).

(B) Photopolymerizable Compound

The first colored photosensitive resin composition may comprise a photopolymerizable compound described below. The photopolymerizable compound may be a monofunctional or multifunctional ester compound having at least one ethylenically unsaturated double bond. In particular, it may be a multifunctional compound having at least two functional groups from the viewpoint of chemical resistance.

The photopolymerizable compound may be selected from the group consisting of dipentaerythritol hexaacrylate, di(trimethylolpropane) tetraacrylate, ethylene glycol di(meth) acrylate, propylene glycol di(meth)acrylate, diethylene glycol di(meth)acrylate, triethylene glycol di(meth)acrylate, 1,6-hexanediol di(meth)acrylate, polyethylene glycol di(meth)acrylate, polypropylene glycol di(meth)acrylate, glycerin tri(meth)acrylate, trimethylolpropane tri(meth)acrylate, pentaerythritol tri(meth)acrylate, a monoester of pentaerythritol tri(meth)acrylate and succinic acid, pentaerythritol tetra (meth)acrylate, dipentaerythritol penta(meth)acrylate, dipentaerythritol hexa(meth)acrylate, a monoester of dipentaerythritol penta(meth)acrylate and succinic acid, pentaerythritol triacrylate-hexamethylene diisocyanate (a reaction product of pentaerythritol triacrylate and hexamethylene diisocyanate), tripentaerythritol hepta(meth) acrylate, tripentaerythritol octa(meth)acrylate, bisphenol A epoxyacrylate, ethylene glycol monomethyl ether acrylate, and a mixture thereof, but it is not limited thereto.

Examples of the photopolymerizable compound commercially available may include (i) monofunctional (meth) acrylate such as Aronix M-101, M-111, and M-114 manufactured by Toagosei Co., Ltd., KAYARAD T4-110S, T-1420, and T4-120S manufactured by Nippon Kayaku Co., Ltd., and V-158 and V-2311 manufactured by Osaka Yuki Kayaku Kogyo Co., Ltd.; (ii) bifunctional (meth)acrylate such as Aronix M-210, M-240, and M-6200 manufactured by Toagosei Co., Ltd., KAYARAD HDDA, HX-220, and R-604 manufactured by Nippon Kayaku Co., Ltd., and V-260, V-312, and V-335 HP manufactured by Osaka Yuki Kayaku Kogyo Co., Ltd.; and (iii) tri- and higher functional (meth)acrylate such as Aronix M-309, M-400, M-403, M-405, M-450, M-7100, M-8030, M-8060, and TO-1382 manufactured by Toagosei Co., Ltd., KAYARAD TMPTA, DPHA, and DPHA-40H manufactured by Nippon Kayaku Co., Ltd., and V-295, V-300, V-360, V-GPT, V-3PA, V-400, and V-802 manufactured by Osaka Yuki Kayaku Kogyo Co., Ltd.

The content of the photopolymerizable compound may be 10 to 200 parts by weight, 10 to 150 parts by weight, 50 to 150 parts by weight, 70 to 150 parts by weight, 70 to 130 parts by weight, 80 to 150 parts by weight, 80 to 120 parts by weight, 90 to 120 parts by weight, or 90 to 100 parts by weight, relative to 100 parts by weight of the first copolymer (A1) on the basis of the solids content exclusive of solvents.

If the amount of the photopolymerizable compound is within the above range, the pattern developability and coating characteristics may be excellent while the film retention rate is maintained to be constant. If the amount of the photopolymerizable compound is less than the above range, the development time becomes longer, which may affect the process and residues. If it exceeds the above range, it may cause a problem that the pattern resolution becomes too high.

(C) Photopolymerization Initiator

The first colored photosensitive resin composition may comprise a photopolymerization initiator described below. The photopolymerization initiator may be any known photopolymerization initiator.

The photopolymerization initiator may be selected from the group consisting of an acetophenone-based compound, a biimidazole-based compound, a triazine-based compound, an onium salt-based compound, a benzoin-based compound, a benzophenone-based compound, a polynuclear quinone-based compound, a thioxanthone-based compound, a diazo-based compound, an imidesulfonate-based compound, an oxime-based compound, a carbazole-based compound, a sulfonium borate-based compound, a ketone-based compound, and a mixture thereof.

Specifically, the photopolymerization initiator may be an oxime-based compound, a triazine-based compound, or a combination thereof. Specifically, a combination of an oxime-based compound and a triazine-based compound may be used.

Particular examples of the photopolymerization initiator may include 2,2'-azobis(2,4-dimethylvaleronitrile), 2,2'-azobis(4-methoxy-2,4-dimethylvaleronitrile), benzoyl peroxide, lauryl peroxide, t-butyl peroxy pivalate, 1,1-bis(t-butylperoxy)cyclohexane, p-dimethylaminoacetophenone, 2-benzyl-2-(dimethylamino)-1-[4-(4-morpholinyl)phenyl]-1-butanone, 2-hydroxy-2-methyl-1-phenyl-propan-1-one, benzyl dimethyl ketal, benzophenone, benzoin propyl ether, diethyl thioxanthone, 2,4-bis (trichloromethyl)-6-p-methoxyphenyl-s-triazine, 2-trichloromethyl-5-styryl-1,3,4-oxodiazole, 9-phenylacridine, 3-methyl-5-amino-((s-triazin-2-yl)amino)-3-phenylcoumarin, 2-(o-chlorophenyl)-4,5-diphenylimidazolyl dimer, 1-phenyl-1,2-propanedione-2-(o-ethoxycarbonyl)oxime, 1-14-(phenylthio)phenyl1-octane-1,2-dione-2-(o-benzoyloxime), o-enzoyl-4'-(benzmercapto) benzoyl-hexyl-ketoxime, 2,4,6-trimethylphenylcarbonyl-diphenylphosphonyloxide, a hexafluorophosphoro-trialkylphenylsulfonium salt, 2-mercaptobenzimidazole, 2,2'-benzothiazolyl disulfide, 2-[4-(2-phenylethenyl)phenyl]-4,6-bis(trichloromethyl)-1,3,5-triazine, 2-dimethylamino-2-(4-methylbenzyl)-1-(4-morpholin-4-ylphenyl)-butane-1-one, and a mixture thereof, but it is not limited thereto.

For reference, examples of the commercially available oxime-based photopolymerization initiator include at least one selected from OXE-01 (BASF), OXE-02 (BASF), OXE-03 (BASF), N-1919 (ADEKA), NCI-930 (ADEKA), NCI-831 (ADEKA), SPI05 (Samyang), SPI02 (Samyang), and SPI03 (Samyang). Examples of the triazine-based photopolymerization initiator include (E)-2-(4-styrylphenyl)-4,6-bis (trichloromethyl)-1,3,5-triazine, 2-[4-(2-phenylethenyl)phenyl]-4,6-bis(trichloromethyl)-1,3,5-triazine (Triazine Y, Tronly) and the like.

The content of the photopolymerization initiator may be 1 to 20 parts by weight, 1 to 15 parts by weight, 1 to 13 parts by weight, 3 to 20 parts by weight, 3 to 15 parts by weight, or 3 to 13 parts by weight, relative to 100 parts by weight of the first copolymer on the basis of the solids content exclusive of solvents.

Specifically, an oxime-based compound in an amount of 1 to 20 parts by weight, 1 to 15 parts by weight, 3 to 20 parts by weight, or 3 to 15 parts by weight may be employed as the photopolymerization initiator relative to 100 parts by weight of the first copolymer (A1).

In addition, a triazine-based compound in an amount of 0.05 to 4 parts by weight, 0.5 to 4 parts by weight, 1 to 4 parts by weight, 1 to 3 parts by weight, 1 to 2.5 parts by weight, 1 to 2 parts by weight, or 1 to 1.5 parts by weight may be employed as the photopolymerization initiator relative to 100 parts by weight of the first copolymer (A1).

If an oxime-based compound is employed in an amount within the above range, the development and coating characteristics can be enhanced together with high sensitivity. In addition, if a triazine-based compound is employed in an amount within the above range, a cured film with excellent chemical resistance and taper angles upon the formation of a pattern may be obtained together with high sensitivity.

(D1) White Pigment

The first colored photosensitive resin composition may comprise a white pigment (D1) to impart a high reflectance.

The white pigment may be a white metallic pigment. For example, it may be at least one selected from the group consisting of titanium oxide ($TiO_2$), zirconium oxide ($ZrO_2$), zinc oxide (ZnO), and silicon dioxide ($SiO_2$).

Since the white pigment has a property of reflecting light, it functions to enhance the reflectance when a cured film is formed from the first colored photosensitive resin composition. Specifically, since the white pigment is composed of particles having a large refractive index, almost 100% of the incident light is reflected and scattered, which helps to enhance the reflectance. If the particles of a pigment are colorless and transparent, light is not absorbed and scattered.

The content of the white pigment (D1) may be 10 to 80 parts by weight, 10 to 70 parts by weight, 20 to 80 parts by weight, 20 to 70 parts by weight, 20 to 65 parts by weight, 30 to 70 parts by weight, or 30 to 65 parts by weight, relative to 100 parts by weight of the first copolymer (A1) on the basis of the solids content exclusive of solvents. Within the above range, it may achieve high reflectance characteristics.

Specifically, the white pigment may comprise, for example, titanium oxide ($TiO_2$).

For example, the white pigment may comprise titanium oxide ($TiO_2$), and the titanium oxide ($TiO_2$) may be employed in an amount of 10 to 80 parts by weight, 10 to 70 parts by weight, 20 to 80 parts by weight, 20 to 70 parts by weight, 20 to 65 parts by weight, 30 to 70 parts by weight, or 30 to 65 parts by weight, relative to 100 parts by weight of the first copolymer (A1) on the basis of the solids content. Within the above range, it may achieve high reflectance characteristics.

The particle diameter of the white pigment may be 120 nm to 400 nm, 150 nm to 400 nm, 200 nm to 400 nm, 230 nm to 350 nm, 230 nm to 330 nm, 250 nm to 400 nm, 250 nm to 380 nm, or 280 nm to 350 nm. When the particle diameter of the white pigment is within the above range, it may achieve high reflectance characteristics. For example, the white pigment may comprise rutile $TiO_2$ having a particle diameter of 120 nm to 400 nm or 250 nm to 400 nm. In such a case, it may be more advantageous for achieving high reflectance characteristics.

(E) Surfactant

The first colored photosensitive resin composition may further comprise a surfactant in order to enhance the coatability and to prevent the generation of defects.

Although the kind of the surfactant is not particularly limited, for example, a fluorine-based surfactant or silicone-based surfactant may be used.

The commercially available silicon-based surfactant may include DC3PA, DC7PA, SH11PA, SH21PA, and SH8400 from Dow Corning Toray Silicone, TSF-4440, TSF-4300, TSF-4445, TSF-4446, TSF-4460, and TSF-4452 from GE Toshiba Silicone, BYK-333, BYK-307, BYK-3560, BYK UV-3535, BYK-361N, BYK-354, and BYK-399 from BYK, and the like. They may be used alone or in combination of two or more thereof.

The commercially available fluorine-based surfactant may include Megaface F-470, F-471, F-475, F-482, F-489, and F-563 from Dainippon Ink Kagaku Kogyo Co. (DIC).

Preferred among these surfactants may be BYK-333 and BYK-307 from BYK and F-563 from DIC from the viewpoint of coatability of the composition.

The content of the surfactant may be 0.01 to 5 parts by weight, 0.01 to 3 parts by weight, 0.1 to 3 parts by weight, 0.1 to 1 part by weight, or 0.1 to 0.5 part by weight, relative to 100 parts by weight of the first copolymer (A1) on the basis of the solids content exclusive of solvents. Within the above range, the photosensitive resin composition may be smoothly coated.

(F) Additive

In addition, the first colored photosensitive resin composition may further comprise at least one additive selected from the group consisting of an epoxy compound, a photobase generator, a thiol-based compound, a compound derived from an epoxy resin, and an adhesion supplement within a range in which the physical properties of a multilayer cured film are not adversely affected.

The epoxy compound may be an unsaturated monomer containing at least one epoxy group, or a homo-oligomer or a hetero-oligomer thereof. Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, or a mixture thereof. Specifically, glycidyl (meth)acrylate may be used.

Examples of the commercially available homo-oligomer of the unsaturated monomer containing at least one epoxy group may include MIPHOTO GHP-03HHP (glycidyl methacrylate, Miwon Commercial Co., Ltd.).

The epoxy compound may further comprise the following structural unit.

Specific examples include structural units derived from styrene; styrene containing an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; styrene containing a halogen such as fluorostyrene, chlorostyrene, bromostyrene, and iodostyrene; styrene containing an alkoxy substituent such as methoxystyrene, ethoxystyrene, and propoxystyrene; p-hydroxy-α-methylstyrene, acetylstyrene; an ethylenically unsaturated compound containing an aromatic ring such as divinylbenzene, vinylphenol, o-vinylbenzyl methyl ether, m-vinylbenzyl methyl ether, p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth) acrylate, 3-methoxybutyl (meth)acrylate, ethoxy diethylene glycol (meth)acrylate, methoxy triethylene glycol (meth) acrylate, methoxy tripropylene glycol (meth)acrylate, poly (ethylene glycol) methyl ether (meth)acrylate, phenyl (meth) acrylate, benzyl (meth)acrylate, 2-phenoxyethyl (meth) acrylate, phenoxydiethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine containing an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, N-cyclohexylmaleimide, and the like. The structural unit derived from the compounds exemplified above may be contained in the epoxy compound alone or in combination of two or more thereof.

The epoxy compound may have a weight average molecular weight of 100 to 30,000 Da, 1,000 to 30,000 Da, 1,000 to 20,000 Da, 3,000 to 20,000 Da, 3,000 to 18,000 Da, 5,000 to 20,000 Da, or 5,000 to 15,000 Da. Within the above range, the step difference by a lower pattern may be advantageously improved, and a pattern profile upon development may be favorable.

The content of the epoxy compound may be 1 to 30 parts by weight, 1 to 10 parts by weight, or 1 to 5 parts by weight, relative to 100 parts by weight of the first copolymer (A1) on the basis of the solids content exclusive of solvents. Within the above range, a pattern profile upon development may be favorable, and the chemical resistance and elastic restoring force may be enhanced.

The photobase generator may comprise a compound having the property of generating a base upon the irradiation of light (or an activated energy ray). For example, it may comprise a highly sensitive compound having a photosensitive range even at a wavelength of 300 nm or more.

The photobase generator may comprise a crosslinkable compound comprising a polyamine photobase generator component. As the present invention comprises such a photobase generator, it is possible to cure at a low temperature and/or during a short period of time when a cured film is prepared and to form a fine pattern. In addition, since the photobase generator generates a base upon the irradiation of light (e.g., UV), it is not inhibited by oxygen in the air, so that it is useful for preventing corrosion or deterioration of the cured film.

When the photobase generator is exposed to light, the pendant photobase group of the polyamine photobase generator component is fragmented or photodecomposed to provide an amine group. The amine group may react with the amine-reactive group of the polyfunctional amine-reactive component to crosslink the (meth)acrylate copolymer component.

Examples of the photobase generator include WPBG-018 (Wako, CAS No. 122831-05-7, 9-anthrimethyl-N,N-diethylcarbamate), WPBG-027 (CAS No. 1203424-93-4, (E)-1-piperidino-3-(2-hydroxyphenyl)-2-propen-1-one), WPBG-266 (CAS No. 1632211-89-2, 1,2-diisopropyl-3-[bis(dimethylamino)methylene]guanidium 2-(3-benzoylphenyl) propionate), WPBG-300 (CAS No. 1801263-71-7, 1,2-dicyclohexyl-4,4,5,5-tetramethylbiguanidinium n-butyltriphenylborate), and the like. The photobase generator may be used alone or in combination of two or more thereof.

The content of the photobase generator may be 0 to 10 parts by weight, 0 to 6 parts by weight, or 0.01 to 5 parts by weight, based on 100 parts by weight of the first copolymer (A1) on the basis of the solids content exclusive of solvents. Within the above range, a pattern profile upon development may be favorable, and the chemical resistance may be excellent.

The thiol-based compound may be used as an additive for free radicals or catalytic functions. It may increase the photocuring conversion rate through UV irradiation or a thermal reaction, and it may increase the epoxy conversion rate by lowering the reaction energy through a thermal reaction. The thiol-based compound prevents the extinction of radicals by oxygen. It also produces the effect of making the structure denser by increasing the degree of crosslinking by a crosslinking action with the photopolymerizable compound (B), thereby improving the degree of curing even at a low temperature.

Examples of the thiol-based compound include a compound having two or more mercapto groups in the molecule. For example, it may be an aliphatic thiol compound or an aromatic thiol compound.

Examples of the aliphatic thiol compound may include methanedithiol, 1,2-ethanedithiol, 1,2-propanedithiol, 1,3-propanedithiol, 1,4-butanedithiol, 1,5-pentanedithiol, 1,6-hexanedithiol, 1,2-cyclohexanedithiol, 3,4-dimethoxybutane-1,2-dithiol, 2-methylcyclohexane-2,3-dithiol, 1,2-dimercaptopropyl methyl ether, 2,3-dimercaptopropyl methyl ether, bis(2-mercaptoethyl) ether, tetrakis(mercaptomethyl)methane, bis(mercaptomethyl) sulfide, bis(mercaptomethyl) disulfide, bis(mercaptoethyl) sulfide, bis(mercaptoethyl) disulfide, bis(mercaptomethylthio)methane, bis(2-mercaptoethylthio)methane, 1,2-bis(2-mercaptomethylthio)ethane, 1,2-bis(2-mercaptoethylthio)ethane, 1,3-bis(mercaptomethylthio)propane, 1,3-bis(2-mercaptoethylthio)propane, 1,2,3-tris(mercaptomethylthio)propane, 1,2,3-tris (2-mercaptoethylthio)propane, 1,2,3-tris(3-mercaptopropylthio)propane, 4-mercaptomethyl-1,8-dimercapto-3,6-dithiaoctane, 5,7-dimercaptomethyl-1,11-dimercapto-3,6,9-trithiaundecane, 4,7-dimercaptomethyl-1,11-dimercapto-3,6,9-trithiaundecane, 4,8-dimercaptomethyl-1,11-dimercapto-3,6,9-trithiaundecane, 1,1,3,3-tetrakis(mercaptomethylthio)propane, 4,6-bis(mercaptomethylthio)-1,3-dithiane, 2-(2,2-bis(mercaptomethylthio)ethyl)-1,3-dithiethane, tetrakis(mercaptomethylthiomethyl)methane, tetrakis(2-mercaptoethylthiomethyl) methane, bis(2,3-dimercaptopropyl) sulfide, 2,5-bismercaptomethyl-1,4-dithiane, ethylene glycol bis(2-mercapto acetate), ethylene glycol bis(3-mercapto propionate), diethylene glycol bis(2-mercapto acetate), diethylene glycol bis(3-mercaptopropionate), 2,3-dimercapto-1-propanol (3-mercaptopropionate), 3-mercapto-1,2-propanediol bis(2-mercaptoacetate), 3-mercapto-1,2-propanediol di(3-mercaptopropionate), trimethylolpropane tris(2-mercaptoacetate), ditrimethylolpropane tetrakis(2-mercaptoacetate), trimethylolpropane tris (3-mercaptopropionate), ditrimethylolpropane tetrakis(3-mercaptopropionate), trimethylolethane tris(2-mercaptoacetate), trimethylolethane tris(3-mercaptopropionate), pentaerythritol tetrakis(2-mercaptoacetate), dipentaerythritol hexa(2-mercaptoacetate), pentaerythritol di(3-mercaptopropionate), pentaerythritol tris(3-mercaptopropionate), pentaerythritol tetra(3-mercaptopropionate) (PETMP), dipentaerythritol hexa(3-mercaptopropionate), glycerin di(2-mercaptoacetate), glycerin tris(2-mercaptoacetate), glycerin di(3-mercaptopropionate), glycerin tris(3-mercaptopropionate), 1,4-cyclohexanediol bis(2-mercaptoacetate), 1,4-cyclohexanediol bis(3-mercaptopropionate), hydroxymethyl sulfide bis(2-mercaptoacetate), hydroxymethyl sulfide bis(3-mercaptopropionate), hydroxyethyl sulfide (2-mercaptoacetate), hydroxyethyl sulfide (3-mercaptopropionate), hydroxymethyldisulfide (2-mercaptoacetate), hydroxymethyldisulfide (3-mercaptopropionate), thioglycolic acid bis(2-mercaptoethyl ester), thiodipropionic acid bis(2-mercaptoethyl ester), and N,N',N"-tris((3-mercaptopropylcarbonyloxyethyl) isocyanurate.

Examples of the aromatic thiol compound may include 1,2-dimercaptobenzene, 1,3-dimercaptobenzene, 1,4-dimercaptobenzene, 1,2-bis(mercaptomethyl)benzene, 1,4-bis(mercaptomethyl)benzene, 1,2-bis(mercaptoethyl)benzene, 1,4-bis(mercaptoethyl)benzene, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl) benzene, 1,3,5-tris(mercaptomethyl)benzene, 1,2,3-tris(mercaptoethyl)benzene, 1,3,5-tris(mercaptoethyl)benzene, 1,2,4-tris(mercaptoethyl)benzene, 2,5-toluenedithiol, 3,4-toluenediol, 1,4-naphthalenediol, 1,5-naphthalenediol, 2,6-naphthalenediol, 2,7-naphthalenediol, 1,2,3,4-tetramercaptobenzene, 1,2,3,5-tetramercaptobenzene, 1,2,4,5-tetramercaptobenzene, 1,2,3,4-tetrakis(mercaptomethyl) benzene, 1,2,3,5-tetrakis(mercaptomethyl)benzene, 1,2,4,5-tetrakis(mercaptomethyl)benzene, 1,2,3,4-tetrakis(mercaptoethyl)benzene, 1,2,3,5-tetrakis (mercaptoethyl) benzene, 1,2,4,5-tetrakis(mercaptoethyl)benzene, 2,2'-dimercaptobiphenyl, and 4,4'-dimercaptobiphenyl.

The thiol-based compound may be an aliphatic thiol compound. Specifically, it may include pentaerythritol tetra (3-mercaptopropionate) (PETMP), SIRIUS-501 (SUBARU-501, Osaka Yukikagaku Kogyo Co., Ltd.), and glycoluril derivatives (TS-G, SHIKOKU CHEMICALS CORPORATION).

The content of the thiol-based compound may be 1 to 30 parts by weight, 1 to 20 parts by weight, 1 to 15 parts by weight, or 1 to 10 parts by weight, relative to 100 parts by weight of the first copolymer (A1) on the basis of the solids content exclusive of solvents. If the amount of the thiol-based compound is within the above range, a pattern profile upon development may be favorable, and the chemical resistance may be excellent.

The compound derived from an epoxy resin has at least one double bond, may have a cardo backbone structure, may be a novolak-based resin, or may be an acrylic acid resin containing a double bond in its side chain.

The weight average molecular weight (Mw) of the compound derived from an epoxy resin may be in the range of 3,000 to 18,000 Da, or 5,000 to 10,000 Da, when determined by gel permeation chromatography referenced to polystyrene. If the amount of the compound derived from an epoxy resin is within the above range, a pattern profile upon development may be favorable, and such properties as chemical resistance and elastic restoring force may be enhanced.

Specifically, the compound derived from an epoxy resin may be a compound having a cardo backbone structure as represented by the following Formula 1:

Particular examples of the $C_{1-10}$ alkylene group may include methylene, ethylene, propylene, isopropylene, butylene, isobutylene, sec-butylene, t-butylene, pentylene, isopentylene, t-pentylene, hexylene, heptylene, octylene, isooctylene, t-octylene, 2-ethylhexylene, nonylene, isononylene, decylene, isodecylene, and the like. Particular examples of the $C_{3-20}$ cycloalkylene group may include cyclopropylene, cyclobutylene, cyclopentylene, cyclohexylene, cycloheptylene, decalinylene, adamantylene, and the like. Particular examples of the $C_{1-10}$ alkyleneoxy group may include methyleneoxy, ethyleneoxy, propyleneoxy, butyleneoxy, sec-butyleneoxy, t-butyleneoxy, pentyleneoxy, hexyleneoxy, heptyleneoxy, octyleneoxy, 2-ethyl-hexyleneoxy, and the like. Particular examples of the $C_{1-10}$ alkyl group may include methyl, ethyl, propyl, isopropyl, butyl, isobutyl, sec-butyl, t-butyl, pentyl, isopentyl, t-pentyl, hexyl, heptyl, octyl, isooctyl, t-octyl, 2-ethylhexyl, nonyl, isononyl, decyl, isodecyl, and the like. Particular examples of the $C_{1-10}$ alkoxy group may include methoxy, ethoxy, propoxy, butyloxy, sec-butoxy, t-butoxy, pentoxy, hexyloxy, heptoxy, octyloxy, 2-ethyl-hexyloxy, and the like. Particular examples of the $C_{2-10}$ alkenyl group may include vinyl, allyl, butenyl, propenyl, and the like. Particular examples of the $C_{6-14}$ aryl group may include phenyl, tolyl, xylyl, naphthyl, and the like.

[Formula 1]

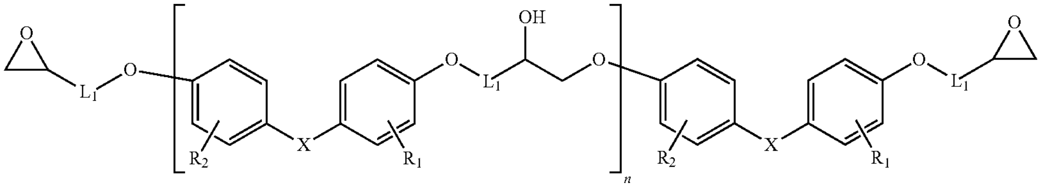

in Formula 1,

X is each independently

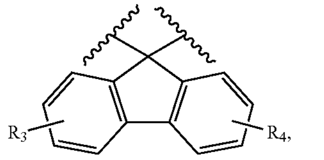

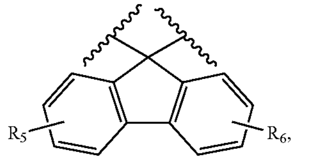

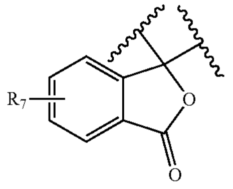 or 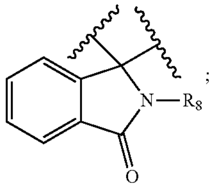 ;

$L_1$ is each independently a $C_{1-10}$ alkylene group, a $C_{3-20}$ cycloalkylene group, or a $C_{1-10}$ alkyleneoxy group; $R_1$ to $R_7$ are each independently H, a $C_{1-10}$ alkyl group, a $C_{1-10}$ alkoxy group, a $C_{2-10}$ alkenyl group, or a $C_{6-14}$ aryl group; $R_8$ is H, methyl, ethyl, $CH_3CHCl$—, $CH_3CHOH$—, $CH_2$═$CHCH_2$—, or phenyl; and n is an integer from 0 to 10.

As an example, the compound derived from an epoxy resin having a cardo backbone structure may be prepared through the following synthesis route as represented by Reaction Scheme 1.

[Reaction Scheme 1]

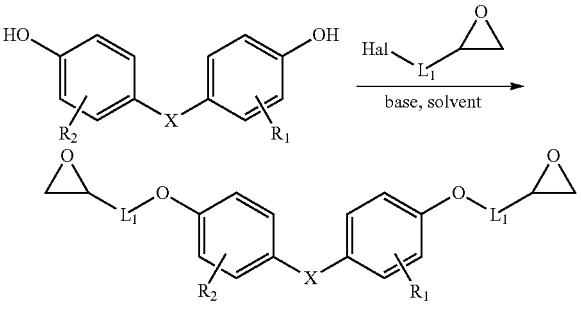

In Reaction Scheme 1,

Hal is halogen; and X, $R_1$, $R_2$, and $L_1$ are the same as defined in Formula 1 above.

The compound derived from an epoxy resin having a cardo backbone structure may be obtained by reacting the epoxy resin having a cardo backbone structure with an unsaturated basic acid to produce an epoxy adduct and then reacting the epoxy adduct thus obtained with a polybasic acid anhydride, or by further reacting the product thus obtained with a monofunctional or multifunctional epoxy compound. Any unsaturated basic acid known in the art, e.g., acrylic acid, (meth)acrylic acid, crotonic acid, cinnamic acid, sorbic acid, and the like may be used. Any polybasic acid anhydride known in the art, e.g., succinic anhydride, maleic anhydride, trimellitic anhydride, pyromellitic anhydride, 1,2,4,5-cyclohexane tetracarboxylic dianhydride, hexahydrophthalic anhydride, and the like, may be used. Any monofunctional or multifunctional epoxy compound known in the art, e.g., glycidyl methacrylate, methyl glycidyl ether, ethyl glycidyl ether, propyl glycidyl ether, isopropyl glycidyl ether, butyl glycidyl ether, isobutyl glycidyl ether, bisphenol Z glycidyl ether, and the like may be used.

As an example, the compound derived from an epoxy resin having a cardo backbone structure may be prepared through the following synthesis route as represented by Reaction Scheme 2.

The content of the compound derived from an epoxy resin may be 0 to 50 parts by weight, 0 to 40 parts by weight, 0.01 to 50 parts by weight, 0.01 to 40 parts by weight, or 0.01 to 30 parts by weight, relative to 100 parts by weight of the first copolymer (A1) on the basis of the solids content exclusive of solvents. If the compound derived from an epoxy resin is employed within the above range, the developability and pattern profile upon development may be favorable.

The first colored photosensitive resin composition may further comprise an adhesion supplement to enhance the adhesiveness to a substrate.

The adhesion supplement may have at least one reactive group selected from the group consisting of a carboxyl group, a (meth)acryloyl group, an isocyanate group, an amino group, a mercapto group, a vinyl group, and an epoxy group. Preferably, it may have an isocyanate group.

[Reaction Scheme 2]

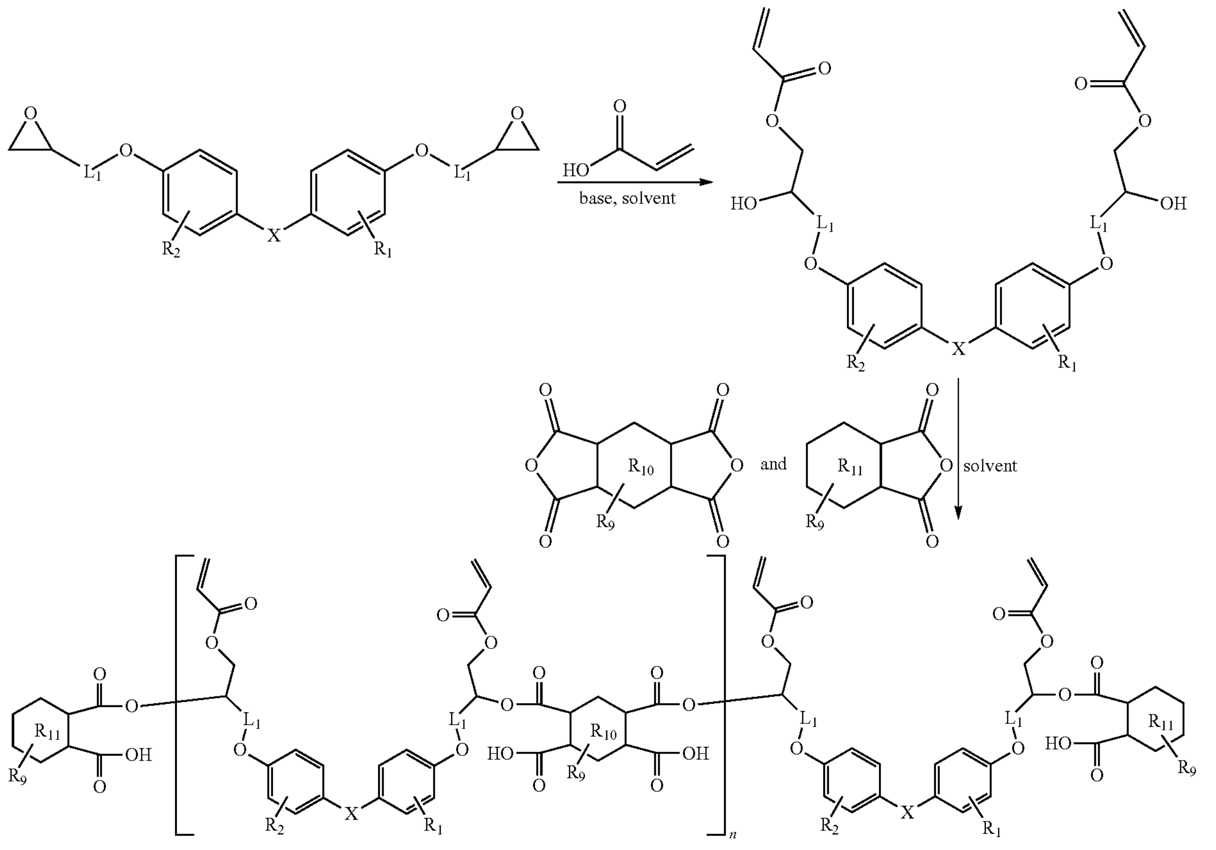

In Reaction Scheme 2, $R_9$ is each independently H, a $C_{1-10}$ alkyl group, a $C_{1-10}$ alkoxy group, a $C_{2-10}$ alkenyl group, or a $C_{6-14}$ aryl group; $R_{10}$ and $R_{11}$ are each independently a saturated or unsaturated aliphatic or aromatic ring having 6 carbon atoms; n is an integer from 1 to 10; and X, $R_1$, $R_2$, and $L_1$ are the same as defined in Formula 1 above.

In the case where the compound derived from an epoxy resin having a cardo backbone structure is used, the cardo backbone structure may improve the adhesiveness of a cured material to a substrate, alkaline resistance, processability, strength, and the like. Further, an image in a fine resolution may be formed in a pattern once an uncured part is removed upon development.

Examples of the adhesion supplement include trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, N-phenylaminopropyltrimethoxysilane, β-(3,4-epoxycyclohexyl)ethyltrimethoxysilane, 3-isocyanate propyltrimethoxysilane, 3-isocyanate propyltriethoxysilane, and a mixture thereof.

Preferably, it may be γ-glycidoxypropyltriethoxysilane, γ-glycidoxypropyltrimethoxysilane, 3-isocyanate propyltrimethoxysilane, 3-isocyanate propyltriethoxysilane, or N-phenylaminopropyltrimethoxysilane. More preferably, it may be N-phenylaminopropyltrimethoxysilane, 3-isocyanatopropyltrimethoxysilane, 3-isocyanatepropyltriethoxysilane, or a mixture thereof, which is an adhesion supplement containing an isocyanate group.

The content of the adhesion supplement may be 0.001 to 5 parts by weight, 0.01 to 5 parts by weight, 0.01 to 4 parts by weight, 0.01 to 3 parts by weight, 0.1 to 4 parts by weight, 0.1 to 3 parts by weight, or 0.1 to 0.2 parts by weight, relative to 100 parts by weight of the first copolymer (A1) on the basis of the solids content. Within the above range, the adhesiveness to a substrate may be further enhanced.

(G) Solvent

The first colored photosensitive resin composition may be prepared as a liquid composition in which the above components are mixed with a solvent. Any solvent known in the art, which is compatible but not reactive with the components in the first colored photosensitive resin composition, may be used as the solvent in the preparation of the photosensitive resin composition.

Examples of the solvent may include glycol ethers such as ethylene glycol monoethyl ether; ethylene glycol alkyl ether acetates such as ethyl cellosolve acetate; esters such as ethyl 2-hydroxypropionate; diethylene glycols such as diethylene glycol monomethyl ether; propylene glycol alkyl ether acetates such as propylene glycol monomethyl ether acetate and propylene glycol propyl ether acetate; and alkoxyalkyl acetates such as 3-methoxybutyl acetate. The solvent may be used alone or in combination of two or more.

The content of the solvent is not specifically limited, but may be 50 to 200 parts by weight or 80 to 150 parts by weight relative to 100 parts by weight of the first copolymer (A1) on the basis of the solids content exclusive of solvents from the viewpoint of the coatability and stability of the first colored photosensitive resin composition. Within the above range, the resin composition is smoothly coated, and the delay margin, which may occur in the working process, is small.

In addition, the first colored photosensitive resin composition may further comprise other additives such as an antioxidant and a stabilizer within a range in which the physical properties of a cured film are not adversely affected.

The first colored photosensitive resin composition comprising the above-described components may be mixed by a common method to be prepared as a liquid composition. For example, a pigment is mixed with a dispersion resin, a dispersant, and a solvent in advance and dispersed therein using a bead mill until the average particle diameter of the pigment reaches a desired value, thereby preparing a pigment dispersion liquid. In such an event, a surfactant and/or a copolymer may be blended in part or in entirety. Added to the pigment dispersion liquid are the remainder of the copolymer and the surfactant, a photopolymerizable compound, and a photopolymerization initiator. An additive such as an epoxy compound or an additional solvent, if necessary, is further blended to a certain concentration, followed by sufficiently stirring them to prepare a first colored photosensitive resin composition in a liquid phase.

The present invention may provide a first cured film by coating such a first colored photosensitive resin composition on a substrate and curing it. Specifically, it is coated on a pre-treated substrate by a spin coating method, a slit coating method, a roll coating method, a screen printing method, an applicator method, or the like in a desired thickness, for example, 4 μm to 8 μm, which is cured to form the first cured film by removing the solvent therefrom. The thickness of the first cured film finally formed may be 10 μm or less, 8 μm or less, 6 μm or less, 4 μm to 9 μm, or 5 μm to 9 μm.

Second Colored Photosensitive Resin Composition

The second colored photosensitive resin composition may comprise (A2) a second copolymer; (B) a photopolymerizable compound; (C) a photopolymerization initiator; and (D2) a pigment other than white. It may further comprise (E) a surfactant, (F) an additive such as an epoxy compound, a thiol-based compound, a photobase generator, and an adhesion supplement, and/or (G) a solvent as described above, if necessary.

The second colored photosensitive resin composition may be coated on the first cured film to form a second cured film. As the second cured film comprises the following components, it may satisfy a high light-shielding property.

Hereinafter, each component will be described in detail.

(A2) Second Copolymer

The second copolymer (A2) comprises (b1) a structural unit derived from an ethylenically unsaturated carboxylic acid, an ethylenically unsaturated carboxylic anhydride, or a combination thereof; and (b2) a structural unit derived from an ethylenically unsaturated compound containing an epoxy group, and it may comprise at least one of (b3) a structural unit derived from an ethylenically unsaturated compound containing fluorine; and (b4) a structural unit derived from an ethylenically unsaturated compound different from (b1) to (b3).

According to an embodiment, the second copolymer may comprise the structural units (b1), (b2), and (b3).

According to another embodiment, the second copolymer may comprise the structural units (b1), (b2), and (b4).

According to still another embodiment, the second copolymer may comprise the structural units (b1) to (b4).

The second copolymer is an alkali-soluble resin for implementing developability and may serve as a base when a cured film is formed and as a structure for forming a final pattern.

(b1) Structural Unit Derived from an Ethylenically Unsaturated Carboxylic Acid, an Ethylenically Unsaturated Carboxylic Anhydride, or a Combination Thereof The structural unit (b1) may be derived from an ethylenically unsaturated carboxylic acid, an ethylenically unsaturated carboxylic anhydride, or a combination thereof.

The ethylenically unsaturated carboxylic acid and the ethylenically unsaturated carboxylic anhydride may be a polymerizable unsaturated monomer containing at least one carboxyl group in the molecule. They may be the same as the compounds exemplified above from which the structural unit (a1) may be derived.

The content of the structural unit (b1) may be 5 to 65% by mole, 10 to 65% by mole, 10 to 50% by mole, 10 to 40% by mole, 10 to 35% by mole, 15 to 35% by mole, 20 to 35% by mole, or 20 to 30% by mole, based on the total number of moles of the structural units constituting the second copolymer. Within the above range, it may have favorable developability.

(b2) Structural Unit Derived from an Ethylenically Unsaturated Compound Containing an Epoxy Group The structural unit (b2) may be derived from an ethylenically unsaturated compound containing an epoxy group.

For example, the ethylenically unsaturated compound containing an epoxy group may be the same as the compound exemplified above from which the structural unit (a3) may be derived.

The content of the structural unit (b2) may be 1% by mole to 40% by mole, 1% by mole to 30% by mole, 1% by mole to 20% by mole, 1% by mole to 10% by mole, 5% by mole to 30% by mole, 5% by mole to 20% by mole, 5% by mole to 15% by mole, or 5% by mole to 12% by mole, based on the total number of moles of the structural units constituting the second copolymer. Within the above range, it may be more advantageous in terms of residues during the process and margins upon pre-bake.

(b3) Structural Unit Derived from an Ethylenically Unsaturated Compound Containing Fluorine The structural unit (b3) may be derived from an ethylenically unsaturated compound containing fluorine.

Examples of the ethylenically unsaturated compound containing fluorine may include nonafluorophenyl (meth)acrylate, 2,2,2-trifluoroethyl (meth)acrylate, hexafluoroisopropyl (meth)acrylate, and octafluoropentyl (meth)acrylate. The structural unit (b2) derived from the ethylenically unsaturated compound containing fluorine functions to enable clear resolution and pattern formation even when ink is injected into the partitions between the barrier ribs when a multilayer cured film comprising the second cured film is used as quantum dot barrier ribs. Specifically, if a fluorine-containing cured film is applied to quantum dot barrier ribs, when a quantum dot solution is filled in an inkjet method, it is possible to prevent the discharged quantum dot solution from overflowing into an adjacent region.

The content of the structural unit (b3) may be 10 to 80% by mole, 10 to 70% by mole, 20 to 70% by mole, 20 to 60% by mole, 30 to 70% by mole, 30 to 60% by mole, 40 to 60% by mole, or 50 to 60% by mole, based on the total number of moles of the structural units constituting the second copolymer. Within the above range, the light-shielding property of a cured film may be further enhanced.

(b4) Structural Unit Derived from an Ethylenically Unsaturated Compound Different from (b1) to (b3)

The structural unit (b4) may be derived from an ethylenically unsaturated compound different from (b1) to (b3).

For example, the ethylenically unsaturated compound different from (b1) to (b3) may be the same as the compounds exemplified above from which the structural units (a2) and/or (a4) may be derived.

The content of the structural unit (b4) may be 10 to 80% by mole, 10 to 70% by mole, 20 to 70% by mole, 20 to 60% by mole, 20 to 50% by mole, 20 to 40% by mole, or 20 to 30% by mole, based on the total number of moles of the structural units constituting the second copolymer. Within the above range, the storage stability of the composition may be maintained, and the film retention rate may be more advantageously enhanced.

According to an embodiment, examples of the structural units constituting the second copolymer may include a copolymer of (meth)acrylic acid/glycidyl (meth)acrylate/styrene/methyl (meth)acrylate, a copolymer of (meth)acrylic acid/glycidyl (meth)acrylate/nonafluorophenyl (meth)acrylate/2,2,2-trifluoroethyl (meth)acrylate, a copolymer of (meth)acrylic acid/glycidyl (meth)acrylate/styrene/nonafluorophenyl (meth)acrylate, a copolymer of (meth)acrylic acid/glycidyl (meth)acrylate/styrene/methyl (meth)acrylate/nonafluorophenyl (meth)acrylate.

The second copolymer comprises (b1) a structural unit derived from methacrylic acid; and (b2) a structural unit derived from glycidyl methacrylate, and it may comprise at least one of (b3) a structural unit derived from nonafluorophenyl methacrylate, 2,2,2-trifluoroethyl methacrylate, or a mixture thereof; and (b4) a structural unit derived from styrene, methyl methacrylate, or a mixture thereof.

The second copolymer may have a weight average molecular weight (Mw) of 4,000 to 20,000 Da, 4,000 to 16,000 Da, 5,000 to 20,000 Da, 5,000 to 16,000 Da, or 10,000 to 16,000 Da. Within the above range, the step difference by a lower pattern may be advantageously improved, a pattern profile upon development may be favorable, and the film retention rate and chemical resistance may be enhanced.

The second copolymer may be prepared by charging to a reactor monomers capable of deriving the above structural units (b1), (b2), (b3), and/or (b4), a radical polymerization initiator, and a solvent, followed by charging nitrogen thereto and slowly stirring the mixture for polymerization.

The radical polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide, lauryl peroxide, t-butyl peroxypivalate, 1,1-bis(t-butylperoxy)cyclohexane, or the like, but it is not limited thereto. The radical polymerization initiator may be used alone or in combination of two or more.

The solvent may be any conventional solvent commonly used in the preparation of a copolymer and may be, for example, propylene glycol monomethyl ether acetate (PGMEA).

(B) Photopolymerizable Compound

The second colored photosensitive resin composition may comprise a photopolymerizable compound as described above.

The content of the photopolymerizable compound may be 10 to 200 parts by weight, 10 to 150 parts by weight, 50 to 150 parts by weight, 70 to 150 parts by weight, 70 to 130 parts by weight, 80 to 150 parts by weight, 80 to 120 parts by weight, 90 to 110 parts by weight, or 95 to 110 parts by weight, relative to 100 parts by weight of the second copolymer (A2) on the basis of the solids content exclusive of solvents.

If the amount of the photopolymerizable compound is within the above range, the pattern developability and coating characteristics may be excellent while the film retention rate is maintained to be constant. If the amount of the photopolymerizable compound is less than the above range, the development time becomes longer, which may affect the process and residues. If it exceeds the above range, it may cause a problem that the pattern resolution becomes too high.

(C) Photopolymerization Initiator

The second colored photosensitive resin composition may comprise a photopolymerization initiator as described above.

The content of the photopolymerization initiator may be 1 to 20 parts by weight, 1 to 15 parts by weight, 1 to 10 parts by weight, or 1 to 5 parts by weight, relative to 100 parts by weight of the second copolymer (A2) on the basis of the solids content exclusive of solvents.

Specifically, an oxime-based compound in an amount of 0.05 to 4 parts by weight, 0.5 to 4 parts by weight, 1 to 4 parts by weight, 1 to 3 parts by weight, 1 to 2.5 parts by weight, or 1 to 2 parts by weight may be employed as the photopolymerization initiator relative to 100 parts by weight of the second copolymer (A2).

In addition, a triazine-based compound in an amount of 0.05 to 4 parts by weight, 0.5 to 4 parts by weight, 1 to 4 parts by weight, 1 to 3 parts by weight, or 1 to 2.5 parts by weight may be employed as the photopolymerization initiator relative to 100 parts by weight of the second copolymer (A2).

If an oxime-based compound is employed in an amount within the above range, the development and coating characteristics may be enhanced together with high sensitivity. In addition, if a triazine-based compound is employed in an amount within the above range, a cured film with excellent chemical resistance and taper angles upon the formation of a pattern may be obtained together with high sensitivity.

(D2) Pigment Other than White

The second colored photosensitive resin composition may comprise a pigment with high color development and excellent thermal resistance to impart a light-shielding property. The pigment may be a pigment other than white (D2).

The pigment other than white may be at least one selected from the group consisting of a yellow pigment, a violet pigment, a red pigment, an orange pigment, a blue pigment, and a black pigment.

The pigment other than white is a colored pigment as described above and functions to enhance the light-shielding property when a cured film is formed from the second colored photosensitive resin composition.

The pigment other than white may comprise any compounds classified as a pigment in the Color Index (published by The Society of Dyers and Colourists) and may comprise any dyes known in the art.

Particular examples of the yellow pigment, violet pigment, red pigment, orange pigment, and blue pigment include C.I. Pigment Yellow 139, 138, 154, 180, and 181; C.I. Pigment Violet 13, 14, 19, 23, 25, 27, 29, 32, 33, 36, 37, and 38; C.I. Pigment Red 254 and 177; C.I. Pigment Orange 64 and 71; C.I. Pigment Blue 15 (15:3, 15:4, 15:6, etc.), 16, 21, 28, 60, 64, and 76. C.I. Pigment Yellow 139, C.I. Pigment Violet 29, C.I. Pigment Red 254, C.I. Pigment Orange 64, and C.I. Pigment Blue 15:6 and 60 are preferred from the viewpoint of a high light-shielding property and a high reflectance.

The black pigment may be a black organic pigment, a black inorganic pigment, or a mixture thereof.

The black organic pigment may be at least one selected from the group consisting of aniline black, lactam black, and perylene black. Specifically, it may be BK-7539 (TOKUSHIKI Co. Ltd.) containing organic black. In such an event, the high reflectance, high light-shielding property, optical density, and the like may be improved.

The black inorganic pigment may be carbon black, titanium black, a metal oxide such as Cu—Fe—Mn-based oxide and synthetic iron black, or the like. Specifically, it may be BK-7544 (TOKUSHIKI Co. Ltd.) containing carbon black.

The content of the yellow pigment may be 3 to 50 parts by weight, 3 to 30 parts by weight, 3 to 20 parts by weight, 3 to 10 parts by weight, or 5 to 10 parts by weight, relative to 100 parts by weight of the second copolymer (A2).

The content of the violet pigment may be 3 to 50 parts by weight, 3 to 30 parts by weight, 3 to 20 parts by weight, 3 to 10 parts by weight, or 5 to 10 parts by weight, relative to 100 parts by weight of the second copolymer (A2).

The content of the red pigment may be 3 to 50 parts by weight, 3 to 30 parts by weight, 3 to 20 parts by weight, 3 to 10 parts by weight, or 5 to 10 parts by weight, relative to 100 parts by weight of the second copolymer (A2).

The content of the orange pigment may be 3 to 50 parts by weight, 3 to 30 parts by weight, 3 to 20 parts by weight, 3 to 10 parts by weight, or 5 to 10 parts by weight, relative to 100 parts by weight of the second copolymer (A2).

The content of the blue pigment may be 3 to 50 parts by weight, 3 to 30 parts by weight, 3 to 20 parts by weight, 3 to 10 parts by weight, or 5 to 10 parts by weight, relative to 100 parts by weight of the second copolymer (A2).

The content of the black organic pigment, black inorganic pigment, or a mixture thereof may be 3 to 50 parts by weight, 3 to 30 parts by weight, 3 to 20 parts by weight, 3 to 10 parts by weight, or 5 to 10 parts by weight, relative to 100 parts by weight of the second copolymer (A2).

If two or more types of the pigment other than white are used, the total content of the pigments may be 3 to 30 parts by weight, 3 to 20 parts by weight, 3 to 15 parts by weight, or 3 to 10 parts by weight, based on 100 parts by weight of the second copolymer (A2) on the basis of the solids content exclusive of solvents.

Within the above ranges, the transmittance is lowered, so that desired high light-shielding characteristics can be satisfied, and high reflectance characteristics can be obtained at the same time.

The particle diameter of the pigment other than white may be 40 nm to 200 nm, 45 nm to 200 nm, 50 nm to 200 nm, 50 nm to 180 nm, 50 nm to 150 nm, 55 nm to 130 nm, 55 nm to 127 nm, or 55 nm to 120 nm. When the particle diameter of the pigment other than white is within the above range, the color development and thermal resistance may be further enhanced, and it may be more advantageous for achieving high reflectance characteristics.

(E) Surfactant

The second colored photosensitive resin composition may further comprise a surfactant as described above in order to enhance the coatability and to prevent the generation of defects.

The content of the surfactant may be 0.01 to 5 parts by weight, 0.01 to 3 parts by weight, 0.1 to 3 parts by weight, 0.1 to 1 part by weight, or 0.1 to 0.5 part by weight, relative to 100 parts by weight of the second copolymer (A2) on the basis of the solids content exclusive of solvents. Within the above range, the photosensitive resin composition may be smoothly coated.

(F) Additive

In addition, the second colored photosensitive resin composition may further comprise at least one additive selected from the group consisting of an epoxy compound, a photobase generator, a thiol-based compound, a compound derived from an epoxy resin, and an adhesion supplement, as described above, within a range in which the physical properties of a multilayer cured film are not adversely affected.

Here, the content of the epoxy compound may be 1 to 30 parts by weight, 1 to 10 parts by weight, or 1 to 5 parts by weight, relative to 100 parts by weight of the second copolymer (A2) on the basis of the solids content exclusive of solvents.

In addition, the content of the photobase generator may be 0 to 10 parts by weight, specifically 0 to 6 parts by weight, more specifically 0.01 to 5 parts by weight, relative to 100 parts by weight of the second copolymer (A2) on the basis of the solids content exclusive of solvents. Within the above range, a pattern profile upon development may be favorable, and the chemical resistance may be excellent.

In addition, the content of the thiol-based compound may be 1 to 30 parts by weight, 1 to 20 parts by weight, 1 to 15 parts by weight, or 1 to 10 parts by weight, relative to 100 parts by weight of the second copolymer (A2) on the basis of the solids content exclusive of solvents. If the amount of the thiol-based compound is within the above range, a pattern profile upon development may be favorable, and the chemical resistance may be excellent.

In addition, the content of the compound derived from an epoxy resin may be 0 to 50 parts by weight, specifically 0 to 40 parts by weight, more specifically 0.01 to 50 parts by weight, 0.01 to 40 parts by weight, or 0.01 to 30 parts by weight, relative to 100 parts by weight of the second copolymer (A2) on the basis of the solids content exclusive of solvents. If the compound derived from an epoxy resin is employed within the above amount range, the developability and pattern profile upon development may be favorable.

(G) Solvent

The second colored photosensitive resin composition may be prepared as a liquid composition in which the above components are mixed with a solvent. The solvent, which is compatible but not reactive with the components in the second colored photosensitive resin composition as described above, may be the same as the solvent described in the first colored photosensitive resin composition.

The content of the solvent is not specifically limited, but may be 50 to 200 parts by weight or 80 to 150 parts by weight relative to 100 parts by weight of the second copolymer (A2) on the basis of the solids content exclusive of solvents from the viewpoint of the coatability and stability of the second colored photosensitive resin composition. Within the above range, the resin composition is smoothly coated, and the delay margin, which may occur in the working process, is small.

In addition, the second colored photosensitive resin composition may further comprise other additives such as an antioxidant and a stabilizer within a range in which the physical properties of a cured film are not adversely affected.

The second colored photosensitive resin composition comprising the above-described components may be mixed by a common method to be prepared as a liquid composition. For example, a pigment is mixed with a dispersion resin, a dispersant, and a solvent in advance and dispersed therein using a bead mill until the average particle diameter of the pigment reaches a desired value, thereby preparing a pigment dispersion liquid. In such an event, a surfactant and/or a copolymer may be blended in part or in entirety. Added to the pigment dispersion liquid are the remainder of the copolymer and the surfactant, a photopolymerizable compound, and a photopolymerization initiator. An additive such as an epoxy compound or an additional solvent, if necessary, is further blended to a certain concentration, followed by sufficiently stirring them to prepare a second colored photosensitive resin composition in a liquid phase.

The present invention may provide a second cured film by coating such a second colored photosensitive resin composition on the first cured film and curing it. Specifically, the second photosensitive resin composition is coated on the first cured film in a desired thickness, for example, 4 μm to 8 μm, which is cured to form the second cured film by removing the solvent therefrom.

The thickness of the second cured film finally formed may be 10 μm or less, 8 μm or less, 6 μm or less, 4 μm to 9 μm, or 5 μm to 9 μm.

Cured Film

The present invention may provide a multilayer cured film formed from the first and second colored photosensitive resin compositions.

Specifically, the multilayer cured film of the present invention comprises a first cured film formed from a first colored photosensitive resin composition and a second cured film formed from a second colored photosensitive resin composition, wherein the first colored photosensitive resin composition comprises (A1) a first copolymer; (B) a photopolymerizable compound; (C) a photopolymerization initiator; and (D1) a white pigment, the second colored photosensitive resin composition comprises (A2) a second copolymer; (B) a photopolymerizable compound; (C) a photopolymerization initiator; and (D2) a pigment other than white, and the multilayer cured film has a total thickness of 6 μm or more.

The multilayer cured film may be used as a structure of quantum dot barrier ribs.

Figure 2:
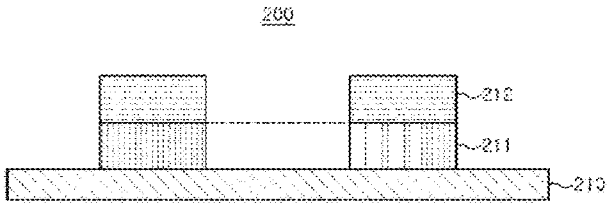
FIG. 2 is a schematic view of a multilayer cured film that comprises a two-layer cured film according to an embodiment of the present invention.
Figure 3:
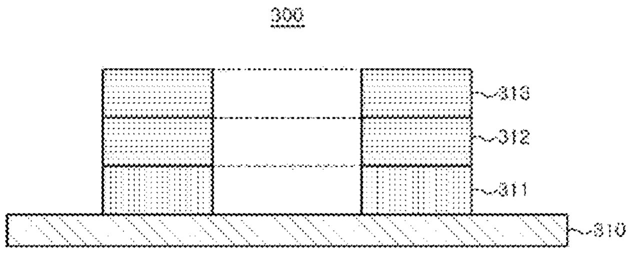
FIG. 3 is a schematic view of a multilayer cured film that comprises a three-layer cured film according to another embodiment of the present invention.
Figure 4:
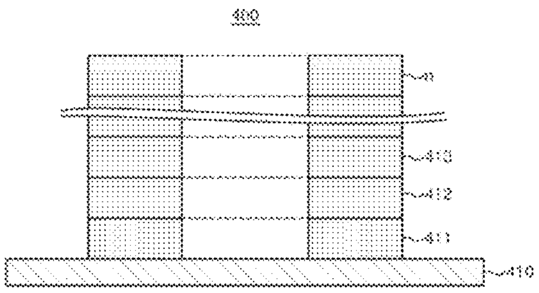
FIG. 4 is a schematic view of a multilayer cured film that comprises an n+1-layer cured film according to still another embodiment of the present invention.

In the multilayer cured film according to an embodiment, a pattern may be formed at regular intervals as shown in FIGS. 2 to 4. It may be composed of one first cured film and a multilayer second cured film. In such an event, the second cured film may have 2 to 10 layers, which may be sequentially laminated on the first cured film.

The first cured film and the second cured film may have a thickness of 10 μm or less, 8 μm or less, 6 μm or less, 4 μm to 9 μm, or 5 μm to 9 μm, respectively. In addition, the multilayer cured film comprising the first cured film and the second cured film may have a total thickness of 6 μm or more, 6 μm to 20 μm, 6 μm to 18 μm, or 10 μm to 18 μm.

According to an embodiment, the multilayer cured film (200) may be composed of two layers comprising a first cured film (211) and a second cured film (212) formed on a substrate (210) as illustrated in FIG. 2. Specifically, the multilayer cured film (200) may be a multilayer cured film of two layers (200), which is prepared by exposing and developing a two-layer cured film to form a pattern and then post-baking it, wherein the two-layer cured film comprises a first cured film (211) formed by coating a first colored photosensitive resin composition on a substrate (210) and curing it; and a second cured film (212) formed by coating a second colored photosensitive resin composition on the first cured film (211) and curing it.

According to another embodiment, the multilayer cured film (300) may be composed of three layers comprising a first cured film of one layer (311) and a second cured film of two layers (312, 313) as illustrated in FIG. 3. Specifically, the multilayer cured film (300) may be a multilayer cured film (300) of three layers, which is prepared by exposing and developing a three-layer cured film to form a pattern and then post-baking it, wherein the three-layer cured film comprises a first cured film (311) formed by coating a first colored photosensitive resin composition on a substrate (310) and curing it; a second cured film (312) formed by coating a second colored photosensitive resin composition on the first cured film (311) and curing it; and a third cured film (313) formed by coating the second colored photosensitive resin composition on the second cured film (312) and curing it.

According to still another embodiment, the multilayer cured film (400) may be a multilayer cured film (400) of n+1 layers comprising a first cured film (411) of one layer and a second cured film of n layers (412, 413, . . . n) as illustrated in FIG. 4. Specifically, the multilayer cured film (400) may be a multilayer cured film of n+1 layers (400), which is prepared by exposing and developing a cured film of n+1 layers to form a pattern and then post-baking it, wherein the cured film of n+1 layers comprises a first cured film (411) formed by coating a first colored photosensitive resin composition on a substrate (410) and curing it; and a second cured film of n layers (412, 413, . . . n) formed by repeating the steps of coating a second colored photosensitive resin composition on the first cured film (411) and curing it. Here, n may be 2 or more, specifically 2 to 10, 2 to 8, 2 to 6, or 2 to 5.

In the multilayer cured film, the thicknesses of the respective cured films may be the same or different.

The multilayer cured film is measured for the height difference through the vertical motion of the equipment probe tip using SCAN PLUS, which is an α-step instrument (Alpha-step profilometer). The thickness of the cured film is obtained from the results. The final film thickness refers to a value measured for the final film of the multilayer cured film prepared by forming a pattern by exposure and development and then post-baking it. It covers the entire multilayer cured film The final film thickness may be 6 μm or more, 6 μm to 20 μm, 6 μm to 18 μm, or 10 μm to 18 μm.

In addition, in the multilayer cured film, the reflectance $R_{SCI}$ measured by the SCI (specular component included) method and the reflectance $R_{SCE}$ measured by the SCE (specular component excluded) method at a wavelength of 360 nm to 740 nm, or 550 nm, may satisfy the following relationships, respectively.

(Relationship 1) $50\% \leq R_{SCI}$ (Relationship 2) $40\% \leq R_{SCE}$ (Relationship 3) $50\% \leq R_{SCE}/R_{SCI}$.

Specifically, $R_{SCI}$ may be 50% or more, 51% or more, 52% or more, 50 to 90%, 50 to 80%, or 53 to 70%; $R_{SCE}$ may be 40% or more, 42% or more, 44% or more, 45% or more, 40 to 90%, 40 to 80%, 43 to 80%, 44 to 70%, or 44 to 60%; and the ratio between them ($R_{SCE}/R_{SCI}$) may be 50% or more, 60% or more, 70% or more, 80% or more, 90% or more, 80 to 99%, 80 to 95%, 90 to 99%, or 90 to 95%. Thus, the characteristics of a high reflectance and a high light-shielding property may be satisfied, and colored light leakage of yellow, red, violet, or the like may be prevented. Since the multilayer cured film thus prepared has excellent properties, it can be advantageously used for quantum dot display devices.

Preparation of a Multilayer Cured Film

The present invention can prepare a multilayer cured film by the following method. It is possible to form a multilayer pattern having a uniform film thickness suitable for quantum dot barrier ribs in a single development process.

Specifically, the process for preparing a multilayer cured film comprises (1) coating a first colored photosensitive resin composition on a substrate and curing it to form a first cured film; (2) coating a second colored photosensitive resin composition on the first cured film and curing it to form a second cured film; and (3) exposing and developing it to form a pattern and then post-baking it. In such an event, the first colored photosensitive resin composition comprises (A1) a first copolymer; (B) a photopolymerizable compound; (C) a photopolymerization initiator; and (D1) a white pigment, and the second colored photosensitive resin composition comprises (A2) a second copolymer; (B) a photopolymerizable compound; (C) a photopolymerization initiator; and (D2) a pigment other than white.

The first colored photosensitive resin composition and the second colored photosensitive resin composition are as described above.

More specifically, the process for preparing a multilayer cured film according to an embodiment may comprise coating a first colored photosensitive resin composition on a substrate and curing it to form a first cured film (step 1).

In the step of forming a first cured film, the photosensitive resin composition according to the present invention is coated on a pre-treated substrate by a spin coating method, a slit coating method, a roll coating method, a screen printing method, an applicator method, or the like in a desired thickness, for example, 4 to 8 μm, which is cured to form the first cured film by removing the solvent therefrom.

Various inorganic substrates such as a glass substrate, an ITO deposition substrate, a $SiN_x$ deposition substrate, and a $SiON_x$ deposition substrate may be used as the substrate. Any material may be used for the substrate as long as it can be used for forming a structure for quantum dot barrier ribs.

The curing for forming the first cured film may be carried out at 70° C. to 140° C. for 50 to 800 seconds to 800 seconds. The curing may be carried out at one time or two or more times.

When the curing is carried out at one time, it may be carried out at 70° C. to 140° C., 80° C. to 130° C., or 90° C. to 130° C. for 50 seconds to 800 seconds, 100 seconds to 800 seconds, 150 seconds to 600 seconds, or 150 seconds to 500 seconds.

When the curing is carried out in tow or more times, for example, it may be carried out as pre-bake at 70° C. to 100° C. or 70° C. to 90° C. for 50 seconds to 400 seconds, 50 seconds to 300 seconds, or 100 seconds to 300 seconds, and then as mid-bake at 80° C. to 140° C. or 90° C. to 130° C. for 100 seconds to 500 seconds or 100 seconds to 300 seconds.

The process for preparing a multilayer cured film according to an embodiment may comprise coating a second colored photosensitive resin composition on the first cured film and curing it to form a second cured film (step 2).

In the step of forming a second cured film, the second colored photosensitive resin composition is coated on the first cured film obtained in the above step 1 in a desired thickness, for example, 4 μm to 8 μm, which is cured to form the second cured film by removing the solvent therefrom.

The curing for forming the second cured film may be carried out at 70° C. to 140° C. for 50 to 800 seconds to 800 seconds. The curing may be carried out at one time or two or more times.

When the curing is carried out at one time, it may be carried out at 70° C. to 140° C., 80° C. to 130° C., or 90° C. to 130° C. for 50 seconds to 800 seconds, 100 seconds to 800 seconds, 150 seconds to 600 seconds, or 150 seconds to 500 seconds.

When the curing is carried out in tow or more times, for example, it may be carried out as pre-bake at 70° C. to 100° C. or 70° C. to 90° C. for 50 seconds to 400 seconds, 50 seconds to 300 seconds, or 100 seconds to 300 seconds, and then as mid-bake at 80° C. to 140° C. or 90° C. to 130° C. for 100 seconds to 500 seconds or 100 seconds to 300 seconds.

The curing conditions for the first cured film and the second cured film may be the same or different.

Immediately after step 2 and before step 3, a second cured film of n layers may be further formed on the second cured film, which is then exposed and developed. In such an event, the photosensitive resin composition used for preparing one or more cured films formed on the second cured film may be the same as, or different from, the photosensitive resin composition used in preparing the second cured film. However, the last cured film (n-th cured film) should be formed of the second colored photosensitive resin composition. It is more advantageous from the viewpoint of light-shielding property that a copolymer comprising a structural unit (b3) derived from an ethylenically unsaturated compound containing fluorine is employed in the second colored photosensitive resin composition used in such a case.

The process for preparing a multilayer cured film according to an embodiment comprises exposing and developing it to form a pattern and then post-baking it (step 3).

In step 3, in order to form a pattern on the first cured film and the second cured film, a mask having a predetermined shape is placed thereon, which is then irradiated with activated rays of 200 nm to 500 nm. As a light source used for the irradiation, a low-pressure mercury lamp, a high-pressure mercury lamp, an extra high-pressure mercury lamp, a metal halide lamp, an argon gas laser, or the like may be used. X-ray, electronic ray, or the like may also be used, if desired. The dose of light for exposure may vary depending on the kind and the compositional ratio of the components of the composition and the thickness of a dried coating. If a high-pressure mercury lamp is used, it may be 500 mJ/cm$^2$ or less (at a wavelength of 365 nm).

After the light exposure step, an aqueous alkaline solution such as sodium carbonate, sodium hydroxide, potassium hydroxide, tetramethylammonium hydroxide, or the like as a developer is used to dissolve and remove unnecessary portions, whereby only an exposed portion remains to form a pattern. An image pattern obtained by the development is cooled to room temperature and post-baked in a hot air circulation-type drying furnace, thereby obtaining a final pattern.

The exposure may be carried out by disposing a mask so that the spacing of each pattern is 10 μm to 30 μm and irradiating an activated ray thereon.

The development may be carried out for 50 seconds to 300 seconds, specifically 100 seconds to 300 seconds.

The curing upon the formation of a pattern, that is, the post-bake may be carried out at 150° C. to 300° C., 180° C. to 280° C., or 200° C. to 260° C. for 10 minutes to 60 minutes, 20 minutes to 50 minutes, or 20 minutes to 40 minutes.

According to the process for preparing a multilayer cured film according to an embodiment, it is possible to form a pattern on each layer (i.e., multilayer pattern) while it has a uniform film thickness suitable for quantum dot barrier ribs in a single development process.

EMBODIMENTS FOR CARRYING OUT THE INVENTION

Hereinafter, the present invention will be described in more detail with reference to the following examples. However, these examples are provided to illustrate the present invention, and the scope of the present invention is not limited thereto only.

In the following synthesis examples, the weight average molecular weight is determined by gel permeation chromatography (GPC, eluent: tetrahydrofuran) referenced to a polystyrene standard.

EXAMPLE

Preparation Example 1: Preparation of a First Copolymer (A1-1)

A 500-ml, round-bottomed flask equipped with a refluxing condenser and a stirrer was charged with 100 g of a monomer mixture composed of 23% by mole of methacrylic acid, 43% by mole of styrene, 9% by mole of glycidyl methacrylate, and 25% by mole of methyl methacrylate, along with 2 g of 2,2'-azobis(2,4-dimethylvaleronitrile) as a radical polymerization initiator, which mixture was dissolved in 300 g of propylene glycol monomethyl ether acetate (PGMEA). Thereafter, the liquid mixture was heated to 70° C. and stirred for 5 hours for polymerization to obtain a copolymer A1-1 having a solids content of 31% by weight. The copolymer A1-1 thus prepared had a weight average molecular weight of 12,000 Da, an acid value of 100 mg KOH/g, and a polydispersity (Mw/Mn) of 2.80.

Preparation Example 2: Preparation of a First Copolymer (A1-2)

The same procedures as in Preparation Example 1 were carried out to prepare a copolymer A1-2 having a solids content of 31% by weight, except that the kinds and contents of the monomers were changed as shown in Table 1 below. The copolymer A1-2 thus prepared had a weight average molecular weight of 14,000 Da, an acid value of 100 mg KOH/g, and a polydispersity (Mw/Mn) of 2.48.

Preparation Example 3: Preparation of a Second Copolymer (A2-1)

The same procedures as in Preparation Example 1 were carried out to prepare a copolymer A2-1 having a solids content of 31% by weight, except that the kinds and contents of the monomers were changed as shown in Table 2 below. The copolymer A2-1 thus prepared had a weight average molecular weight of 14,100 Da, an acid value of 100 mg KOH/g, and a polydispersity (Mw/Mn) of 3.23.

Preparation Example 4: Preparation of a Second Copolymer (A2-2)

A 250-ml, round-bottomed flask equipped with a refluxing condenser and a stirrer was charged with 30 g of a monomer mixture composed of 30% by mole of methacrylic acid, 10% by mole of glycidyl methacrylate, 50% by mole of nonafluorophenyl methacrylate, and 10% by mole of trifluorohexyl methacrylate, along with 2.74 g of V-59 as a radical polymerization initiator, which mixture was dissolved in 30 g of propylene glycol monomethyl ether acetate (PGMEA). Thereafter, the liquid mixture was added dropwise over 4 hours to a flask containing a solvent heated to 80° C. under a nitrogen atmosphere, which was then polymerized for 20 hours to obtain a copolymer A2-2 having a solids content of 30 to 33% by weight. The copolymer A2-2 thus prepared had a weight average molecular weight of 15,000 Da, an acid value of 90 to 100 mg KOH/g, and a polydispersity (Mw/Mn) of 2.04.

Preparation Example 5: Preparation of a Second Copolymer (A2-3)

A 500-ml, round-bottomed flask equipped with a refluxing condenser and a stirrer was charged with 100 g of a monomer mixture composed of 23% by mole of methyl methacrylate, 50% by mole of cyclohexyl methacrylate, and 27% by mole of methacrylic acid, along with 300 g of propylene glycol monomethyl ether acetate (PGMEA) as a solvent and 2 g of 2,2'-azobis(2,4-dimethylvaleronitrile) as a radical polymerization initiator. The mixture was then heated to 70° C. and stirred for 5 hours to obtain a copolymer A2-3 having a solids content of 31% by weight. The copolymer A2-3 thus prepared had an acid value of 107 mg KOH/g and a polystyrene-referenced weight average molecular weight (Mw) measured by gel permeation chromatography of 34,432 Da.

Preparation Example 6: Preparation of a Second Copolymer (A2-4)

A 500-ml, round-bottomed flask equipped with a refluxing condenser and a stirrer was charged with 100 g of a monomer mixture composed of 26% by mole of methyl methacrylate, 40% by mole of styrene, and 34% by mole of methacrylic acid, along with 300 g of propylene glycol monomethyl ether acetate (PGMEA) as a solvent and 2 g of 2,2'-azobis(2,4-dimethylvaleronitrile) as a radical polymerization initiator. The mixture was then heated to 70° C. and stirred for 5 hours to obtain a copolymer A2-4 having a solids content of 31% by weight. The copolymer A2-4 thus prepared had an acid value of 161 mg KOH/g and a polystyrene-referenced weight average molecular weight (Mw) measured by gel permeation chromatography of 16,313 Da.

TABLE 1

| | Structural unit (a1) | Structural unit (a2) | Structural unit (a3) | | Structural unit (a4) | | Weight average molecular weight | Polydispersity | Acid value |
|---|---|---|---|---|---|---|---|---|---|
| (mol %) | MAA | STY | GMA | 4-HBAGE | MMA | N-PMI | (Mw) (Da) | (Mw/Mn) | (mg KOH/g) |
| Prep. Ex. 1 | 23 | 43 | 9 | — | 25 | — | 12,000 | 2.80 | 100 |
| Prep. Ex. 2 | 35 | 4 | — | 10 | — | 51 | 14,000 | 2.48 | 100 |

Methacrylic acid: MAA

Styrene: STY

Glycidyl methacrylate: GMA 4-hydroxybutyl acrylate glycidyl ether: 4-HBAGE

Methyl methacrylate: MMA

N-phenylmaleimide: N-PMI

TABLE 2

| | Structural unit (b1) | Structural unit (b2) | Structural unit (b3) | | Structural unit (b4) | | | Weight average molecular weight | PD | Acid value |
|---|---|---|---|---|---|---|---|---|---|---|
| (mol %) | MAA | GMA | nona FPMA | TFEMA | STY | MMA | CHMA | (Mw) (Da) | (Mw/Mn) | (mg KOH/g) |
| Prep. Ex. 3 | 25 | 9 | — | — | 43 | 23 | — | 14,100 | 3.23 | 100 |
| Prep. Ex. 4 | 30 | 10 | 50 | 10 | — | — | — | 15,000 | 2.04 | 90-100 |
| Prep. Ex. 5 | 27 | — | — | — | — | 23 | 50 | 34,432 | 2.07 | 107 |
| Prep. Ex. 6 | 34 | — | — | — | 40 | 26 | — | 16,313 | 2.28 | 161 |

Methacrylic acid: MAA

Styrene: STY

Glycidyl methacrylate: GMA

Nonafluoropentyl methacrylate: nonaFPMA 2,2,2-trifluoroethyl methacrylate: TFEMA Methyl methacrylate: MMA Cyclohexyl methacrylate: CHMA

Example: Preparation of a Photosensitive Resin Composition

The components used in the following examples are as follows.

TABLE 3

| | | Component | Solids content (wt %) | Manufacturer |
|---|---|---|---|---|
| First copolymer (A1) | A1-1 | Prep. Ex. 1 | 31 | — |
| | A1-2 | Prep. Ex. 2 | 31 | — |
| Second copolymer (A2) | A2-1 | Prep. Ex. 3 | 31 | — |
| | A2-2 | Prep. Ex. 4 | 30-33 | — |
| | A2-3 | Prep. Ex. 5 | 31 | — |
| | A2-4 | Prep. Ex. 6 | 31 | — |
| Photopolymerizable compound (B) | | Dipentaerythritol hexaacrylate (DPHA) | 100 | Nippon Kayaku |
| Photopolymerization initiator (C) | C-1 | SPI05 | 100 | Samyang |
| | C-2 | SPI02 | 100 | Samyang |
| | C-3 | (E)-2-(4-styrylphenyl)-4,6-bis(trichloromethyl)-1,3,5-triazine (Triazine-Y) | 100 | Tronly |
| White pigment | D1-1 | TIS-010 (containing $TiO_2$) (TIS010) | 100 | Iridos Co. Ltd. |
| | D1-2 | TIS-010 (containing $TiO_2$) (TIS018) | 100 | Iridos Co. Ltd. |
| | D1-3 | TIS-010 (containing $TiO_2$) (TIS009) | 100 | Iridos Co. Ltd. |
| | D1-4 | TIS-010 (containing $TiO_2$) (TIS007) | 100 | Iridos Co. Ltd. |
| Pigment other than white (D2) | D2-1 | PY139-2 (Pigment Yellow (139)) | 100 | Iridos Co. Ltd. |
| | D2-2 | PV3 (Pigment Violet (29)) | 100 | Iridos Co. Ltd. |
| | D2-3 | PR254-7 (Pigment Red (254)) | 100 | Iridos Co. Ltd. |
| | D2-4 | Orange-D01 (Pigment Orange (64)) | 100 | Iridos Co. Ltd. |
| | D2-5 | Blue-B2 (Pigment Blue (15:6)) | 100 | Iridos Co. Ltd. |
| | D2-6 | BK-7539 (Organic Carbon) | 100 | TOKUSHIKI |
| | D2-7 | BK-7544 (Carbon Black) | 100 | TOKUSHIKI |
| Surfactant (E) | | F-563 | 100 | DIC |
| Additive (F) | F-1 | Epoxy compound (GHP03HHP) | 100 | Miwon |
| | F-2 | N-phenyl-3-aminopropyltrimethoxysilane (XS1075) | 100 | JNC |
| Solvent (E) | | Propylene glycol monomethyl ether acetate (PGMEA) | — | Chemtronics |

Example 1: Preparation of a First Colored Photosensitive Resin Composition 80 parts by weight of the first copolymer (A1-1) of Preparation Example 1, 20 parts by weight of the first copolymer (A1-2) of Preparation Example 2, 92 parts by weight of DPHA as a photopolymerizable compound (B), 8.5 parts by weight of SPI05 (C-1), 1.4 parts by weight of SPI02 (C-2), and 1.4 parts by weight of Trizine-Y (C-3) as a photopolymerization initiator (C), 65 parts by weight of TIS-010 as a white pigment (D1), 0.2 part by weight of F-563 as a surfactant (E), and 3 parts by weight of an epoxy compound (F-1) and 0.3 part by weight of XS1075 (F-2) as an additive were homogeneously blended. Here, the respective contents are those based on the solids content exclusive of solvents. The mixture was dissolved in PGMEA as a solvent such that the solids content of the mixture was 27% by weight. The resultant was mixed using a shaker for 2 hours to prepare a first colored photosensitive resin composition in a liquid phase.

Example 2: Preparation of a Second Colored Photosensitive Resin Composition 100 parts by weight of the second copolymer (A2-1) of Preparation Example 3, 100 parts by weight of DPHA as a photopolymerizable compound (B), 1.1 parts by weight of SPI02 (C-2) and 2.2 parts by weight of Trizine-Y (C-3) as a photopolymerization initiator (C), 6 parts by weight of PY139-3 (D-1) as a pigment other than white (D2), and 0.2 part by weight of F-563 as a surfactant (E) were homogeneously blended. Here, the respective contents are those based on the solids content exclusive of solvents. The mixture was dissolved in PGMEA as a solvent such that the solids content of the mixture was 19% by weight. The resultant was mixed using a shaker for 2 hours to prepare a second colored photosensitive resin composition in a liquid phase.

Example 3: Preparation of a Multilayer Cured Film

A cured film was prepared in the following manner using the first colored photosensitive resin composition and/or the second colored photosensitive resin composition prepared in Examples 1 and 2.

The first colored photosensitive resin composition was pre-treated using a 1-μm syringe filter, coated on a glass substrate using a spin coater, and pre-baked at 90° C. for 150 seconds to form a coating film having a thickness of 6.0 μm or more. The coating film was further subjected to mid-bake at 130° C. for 300 seconds to remove the solvent to form a first cured film (i.e., a lower film).

Then, the second colored photosensitive resin composition pretreated using a 1-μm syringe filter was coated on the first cured film and pre-baked at 90° C. for 150 seconds to form a second cured film having a thickness of 6.0 μm or more (i.e., an upper film), thereby obtaining a multilayer cured film of two layers.

A mask was placed on the multilayer cured film such that an area of 5 cm by 5 cm thereof was 100% exposed to light and that the gap with the substrate was minimized in a contact manner. Thereafter, it was exposed to light at an exposure dose of 150 $mJ/cm^2$ based on a wavelength of 365 nm for a certain period of time using an aligner (model name: MA6) that emits light having a wavelength of 200 nm to 450 nm. It was then developed with an aqueous developer of 0.04% by weight of potassium hydroxide at 23° C. until the unexposed portion was completely washed out. The pattern thus formed was post-baked in an oven at 230° C. for 30 minutes to obtain a multilayer cured film having a total thickness of 6.0 to 18 (±0.5) μm.

Examples 4 to 14

A multilayer cured film of Examples 4 to 14 was prepared in the same manner as in Example 3, except that the first colored photosensitive resin composition and the second colored photosensitive resin composition having the components and contents as shown in Tables 4 and 5 were used.

TABLE 4

| Solids content | | First copolymer | | Second copolymer | | | | Photopolymerizable | Photopolymerization initiator (C) | | |
|---|---|---|---|---|---|---|---|---|---|---|---|
| (part by weight) | | A1-1 | A1-2 | A2-1 | A2-2 | A2-3 | A2-4 | compound (B) | C-1 | C-2 | C-3 |
| Ex. 3 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| Ex. 4 | First cured film | 80 | 20 | — | — | — | — | 92 | 7.9 | 1.3 | 1.3 |
| | Second cured film | — | — | 100 | — | — | — | 100 | 0 | 1.1 | 2.2 |
| Ex. 5 | First cured film | 80 | 20 | — | — | — | — | 92 | 7.4 | 1.2 | 1.2 |
| | Second cured film | — | — | 100 | — | — | — | 100 | 0 | 1.1 | 2.2 |
| Ex. 6 | First cured film | 80 | 20 | — | — | — | — | 108 | 2.4 | 1.2 | 1.2 |
| | Second cured film | — | — | 100 | — | — | — | 100 | 0 | 1.1 | 2.2 |
| Ex. 7 | First cured film | 80 | 20 | — | — | — | — | 92 | 8.5 | 1.4 | 1.4 |
| | Second cured film | — | — | 96 | 4 | — | — | 100 | 0 | 1.1 | 0.2 |
| Ex. 8 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| Ex. 9 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| Ex. 10 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| Ex. 11 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| Ex. 12 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| Ex. 13 | First cured film | 80 | 20 | — | — | — | — | 92 | 8.5 | 1.4 | 1.4 |
| | Second cured film | — | — | 100 | — | — | — | 100 | 0 | 1.1 | 2.2 |

TABLE 4-continued

| Solids content (part by weight) | | First copolymer | | Second copolymer | | | | Photopolymerizable compound (B) | Photopolymerization initiator (C) | | |
|---|---|---|---|---|---|---|---|---|---|---|---|
| | | A1-1 | A1-2 | A2-1 | A2-2 | A2-3 | A2-4 | | C-1 | C-2 | C-3 |
| Ex. 14 | First cured film | 80 | 20 | — | — | — | — | 92 | 8.5 | 1.4 | 1.4 |
| | Second cured film | — | — | — | — | — | 100 | 100 | 0 | 1.2 | 2.3 |

TABLE 5

| (Part by weight) | | White pigment (D1) | Pigment other than white (D2) | | | | | | | Surfactant (E) | Additive (F) | | Solvent (G) | $TiO_2$ content | Pigment particle diameter (nm) |
|---|---|---|---|---|---|---|---|---|---|---|---|---|---|---|---|
| | | | D2-1 | D2-2 | D2-3 | D2-4 | D2-5 | D2-6 | D2-7 | | F-1 | F-2 | | | |
| Ex. 3 | First cured film | 65 | — | — | — | — | — | — | — | 0.2 | 3 | 0.3 | 100 | 65 | 263 (rutile) |
| | Second cured film | — | 6 | — | — | — | — | — | — | 0.2 | 0 | 0 | 100 | — | 59 |
| Ex. 4 | First cured film | 48 | — | — | — | — | — | — | — | 0.2 | 3 | 0.3 | 100 | 48 | 263 (rutile) |
| | Second cured film | — | 6 | — | — | — | — | — | — | 0.2 | 0 | 0 | 100 | — | 59 |
| Ex. 5 | First cured film | 34 | — | — | — | — | — | — | — | 0.2 | 3 | 0.3 | 100 | 34 | 263 (rutile) |
| | Second cured film | — | 6 | — | — | — | — | — | — | 0.2 | 0 | 0 | 100 | — | 59 |
| Ex. 6 | First cured film | 22 | — | — | — | — | — | — | — | 0.2 | 1 | 0.3 | 100 | 22 | 263 (rutile) |
| | Second cured film | — | 6 | — | — | — | — | — | — | 0.2 | 0 | 0 | 100 | — | 59 |
| Ex. 7 | First cured film | 64 | — | — | — | — | — | — | — | 0.2 | 3 | 0.3 | 100 | 64 | 263 (rutile) |
| | Second cured film | — | 6 | — | — | — | — | — | — | 0.2 | 0 | 0 | 100 | — | 59 |
| Ex. 8 | First cured film | 65 | — | — | — | — | — | — | — | 0.2 | 3 | 0.3 | 100 | 65 | 263 (rutile) |
| | Second cured film | — | — | 6 | — | — | — | — | — | 0.2 | 0 | 0 | 100 | — | 108 |
| Ex. 9 | First cured film | 65 | — | — | — | — | — | — | — | 0.2 | 3 | 0.3 | 100 | 65 | 263 (rutile) |
| | Second cured film | — | — | — | 6 | — | — | — | — | 0.2 | 0 | 0 | 100 | — | 68 |
| Ex. 10 | First cured film | 65 | — | — | — | — | — | — | — | 0.2 | 3 | 0.3 | 100 | 65 | 263 (rutile) |
| | Second cured film | — | — | — | — | 6 | — | — | — | 0.2 | 0 | 0 | 100 | — | 127 |
| Ex. 11 | First cured film | 65 | — | — | — | — | — | — | — | 0.2 | 3 | 0.3 | 100 | 65 | 263 (rutile) |
| | Second cured film | — | — | — | — | — | 6 | — | — | 0.2 | 0 | 0 | 100 | — | 49 |
| Ex. 12 | First cured film | 65 | — | — | — | — | — | — | — | 0.2 | 3 | 0.3 | 100 | 65 | 263 (rutile) |
| | Second cured film | — | — | — | — | — | — | 6 | — | 0.2 | 0 | 0 | 100 | — | 119 |
| Ex. 13 | First cured film | 65 | — | — | — | — | — | — | — | 0.2 | 3 | 0.3 | 100 | 65 | 263 (rutile) |
| | Second cured film | — | — | — | — | — | — | — | 6 | 0.2 | 0 | 0 | 100 | — | 65 |
| Ex. 14 | First cured film | 65 | — | — | — | — | — | — | — | 0.2 | 3 | 0.3 | 100 | 65 | 263 (rutile) |
| | Second cured film | — | 7 | — | | | | | | 0.2 | 0 | 0 | 100 | — | 59 |

Comparative Examples 1 to 9

A multilayer cured film of Comparative Examples 1 to 9 was prepared in the same manner as in Example 3, except that the first colored photosensitive resin composition and the second colored photosensitive resin composition having the components and contents as shown in Tables 6 and 7 were used.

TABLE 6

| (Part by weight) | | First copolymer A1-1 | A1-2 | Second copolymer A2-1 | A2-2 | A2-3 | A2-4 | Photopolymerizable compound (B) | Photopolymerization initiator (C) C-1 | C-2 | C-3 |
|---|---|---|---|---|---|---|---|---|---|---|---|
| C. Ex. 1 | First cured film | — | — | — | — | 100 | — | 92 | 8.5 | 1.4 | 1.4 |
| | Second cured Film | — | — | — | — | — | 100 | 100 | 0 | 1.1 | 2.2 |
| C. Ex. 2 | First cured film | — | — | — | — | 100 | — | 92 | 8.5 | 1.4 | 1.4 |
| | Second cured film | — | — | 100 | — | — | — | 100 | 0 | 1.1 | 2.2 |
| C. Ex. 3 | First cured film | 80 | 20 | — | — | — | — | 92 | 1.2 | 0.7 | 1.2 |
| | Second cured film | — | — | 100 | — | — | — | 100 | 0 | 1.1 | 2.2 |
| C. Ex. 4 | First cured film | 80 | 20 | — | — | — | — | 108 | 8.5 | 1.4 | 1.4 |
| | Second cured film | — | — | 100 | — | — | — | 100 | 0 | 1.1 | 2.2 |
| C. Ex. 5 | First cured film | 80 | 20 | — | — | — | — | 92 | 8.5 | 1.4 | 1.4 |
| | Second cured film | — | — | 100 | — | — | — | 100 | 0 | 1.1 | 2.2 |
| C. Ex. 6 | First cured film | 80 | 20 | — | — | — | — | 117 | 1.2 | 0.7 | 1.2 |
| | Second cured film | — | — | 100 | — | — | — | 100 | 0 | 1.1 | 2.2 |
| C. Ex. 7 | First cured film | 80 | 20 | — | — | — | — | 92 | 7 | 1.2 | 1.2 |
| | Second cured film | — | — | 100 | — | — | — | 100 | 0 | 1.1 | 2.2 |
| C. Ex. 8 | First cured film | 80 | 20 | — | — | — | — | 92 | 7.4 | 1.2 | 1.2 |
| | Second cured film | — | — | 100 | — | — | — | 100 | 0 | 1.1 | 2.2 |
| C. Ex. 9 | First cured film | 80 | 20 | — | — | — | — | 92 | 8.5 | 1.4 | 1.4 |
| | Second cured film | — | — | — | — | — | 100 | 100 | 0 | 1.4 | 2.8 |

TABLE 7

| (Part by weight) | | White pigment (D1) D1-1 | D1-2 | D1-3 | D1-4 | Pigment other than white (D2) D2-1 | Surfactant (E) | Additive (F) F-1 | F-3 | Solvent (G) | $TiO_2$ content | Pigment particle diameter (nm) |
|---|---|---|---|---|---|---|---|---|---|---|---|---|
| C. Ex. 1 | First cured film | 45 | — | — | — | — | 0.2 | 0 | 0.5 | 100 | 45 | 263 (rutile) |
| | Second cured film | — | — | — | — | 12.5 | 0.2 | 0 | 0 | 100 | — | 59 |
| C. Ex. 2 | First cured film | 45 | — | — | — | — | 0.2 | 0 | 0.5 | 100 | 45 | 263 (rutile) |
| | Second cured film | — | — | — | — | 12.5 | 0.2 | 0 | 0 | 100 | — | 68 |
| C. Ex. 3 | First cured film | — | 65 | — | — | — | 0.2 | 0 | 0.5 | 100 | 65 | 33 (anatase) |
| | Second cured film | — | — | — | — | 6 | 0.2 | 0 | 0 | 100 | — | 59 |
| C. Ex. 4 | First cured film | — | — | 42 | — | — | 0.2 | 0 | 0.5 | 100 | 42 | 60 (rutile) |
| | Second cured film | — | — | — | — | 12.5 | 0.2 | 0 | 0 | 100 | — | 68 |
| C. Ex. 5 | First cured film | — | — | — | 42 | — | 0.2 | 0 | 0.5 | 100 | 42 | 103 (rutile) |
| | Second cured film | — | — | — | — | 12.5 | 0.2 | 0 | 0 | 100 | — | 68 |
| C. Ex. 6 | First cured film | 11 | — | — | — | — | 0.2 | 0 | 0.5 | 100 | 11 | 263 (rutile) |
| | Second cured film | — | — | — | — | 12.5 | 0.2 | 0 | 0 | 100 | — | 59 |

TABLE 7-continued

| (Part by weight) | | White pigment (D1) D1-1 | D1-2 | D1-3 | D1-4 | Pigment other than white (D2) D2-1 | Surfactant (E) | Additive (F) F-1 | F-3 | Solvent (G) | $TiO_2$ content | Pigment particle diameter (nm) |
|---|---|---|---|---|---|---|---|---|---|---|---|---|
| C. Ex. 7 | First cured film | 21 | — | — | — | — | 0.2 | 0 | 0.5 | 100 | 21 | 263 (rutile) |
| | Second cured film | — | — | — | — | 12.5 | 0.2 | 0 | 0 | 100 | — | 59 |
| C. Ex. 8 | First cured film | 34 | — | — | — | — | 0.2 | 0 | 0.5 | 100 | 34 | 263 (rutile) |
| | Second cured film | — | — | — | — | 12.5 | 0.2 | 0 | 0 | 100 | — | 59 |
| C. Ex. 9 | First cured film | 65 | — | — | — | — | 0.2 | 0 | 0.5 | 100 | 65 | 263 (rutile) |
| | Second cured film | — | — | — | — | 62.5 | 0.2 | 0 | 0 | 100 | — | 59 |

Evaluation Example 1: Development Time

In the process of preparing a cured film, the time for which the unexposed portion was completely washed out with an aqueous solution of 0.04% by weight of potassium hydroxide (until the stage O-ring part of the development apparatus underneath the substrate was completely seen) was measured.

○: when the developing time was 200 seconds or less x: when the development time exceeded 200 seconds

Evaluation Example 2: Resolution

In order to measure the resolution of a pattern and the critical dimension (CD; unit: μm) of a line pattern in the cured films obtained in the Examples, the line CD was observed with a micro-optical microscope (STM6-LM, manufacturer: OLYMPUS) and X-ray scanning electron microscope (SEM; S4300). The results are shown in Tables 8 and 9 below and FIG. 5.

○: when the line CD was greater than 0 μm to 40 μm x: when the line CD was greater than 40 μm or 0 μm

Evaluation Example 3: Film Thickness

The cured films obtained in the Examples were each measured for the height difference through the vertical motion of the equipment probe tip using SCAN PLUS, which is an α-step instrument (Alpha-step profilometer). The thickness thereof was obtained from the results.

For the initial film thickness, the thickness of the film formed immediately after the pre-bake of the upper film was measure. For the final film thickness, the film thickness after post-bake was measured.

○: when the initial thickness and the final thickness were each 6 μm or more x: when the initial thickness and the final thickness were each less than 6 μm

Evaluation Example 4: Reflectance

The cured films obtained in the Examples were each measured for the reflectance $R_{SCI}$ by the SCI (specular component included) method and the reflectance $R_{SCE}$ by the SCE (specular component excluded) method using a spectrophotometer device (CM-3700A). The ratio between them ($R_{SCE}/R_{SCI}$) was calculated.

If the total reflectance ($R_{SCI}$) was 50% or more, it was evaluated as o; if it was less than 50%, it was evaluated as x If the scattered reflectance ($R_{SCE}$) was 40% or more, it was evaluated as o; if it was less than 40%, it was evaluated as x If the ratio of $R_{SCE}/R_{SCI}$ was 50% or more, it was evaluated as o; if it was less than 50%, it was evaluated as x

Evaluation Example 5: Contact Angle

The cured films obtained in the Examples were each measured for a contact angle using deionized water (DI water) and a contact angle measurement device (DM300, Kyowa).

TABLE 8

| | Development time (second) | | Resolution (μm) | | Initial film thickness (μm) | | Final film thickness (μm) | | Contact angle (°; DI water) |
|---|---|---|---|---|---|---|---|---|---|
| Ex. 3 | ○ ○ | 107 | ○ ○ | 25 | ○ ○ | 14.18 | ○ ○ | 12.20 | 93.00 |
| Ex. 4 | ○ ○ | 115 | ○ ○ | 24 | ○ ○ | 14.60 | ○ ○ | 12.40 | 78.00 |
| Ex. 5 | ○ ○ | 133 | ○ ○ | 27 | ○ ○ | 14.70 | ○ ○ | 12.80 | 78.00 |
| Ex. 6 | ○ ○ | 80 | ○ ○ | 20 | ○ ○ | 13.90 | ○ ○ | 12.10 | 90.00 |
| Ex. 7 | ○ ○ | 115 | ○ ○ | 26 | ○ ○ | 9.79 | ○ ○ | 9.12 | 101.00 |
| Ex. 8 | ○ ○ | 80 | ○ ○ | 35 | ○ ○ | 13.80 | ○ ○ | 12.04 | 95.00 |
| Ex. 9 | ○ ○ | 100 | ○ ○ | 22 | ○ ○ | 14.60 | ○ ○ | 12.25 | 92.00 |

TABLE 8-continued

| | Development time (second) | Resolution (μm) | Initial film thickness (μm) | Final film thickness (μm) | Contact angle (°; DI water) |
|---|---|---|---|---|---|
| Ex. 10 | ○ 97<br>○ | ○ 22<br>○ | ○ 13.40<br>○ | ○ 12.34<br>○ | 93.00 |
| Ex. 11 | ○ 104<br>○ | ○ 35<br>○ | ○ 13.73<br>○ | ○ 12.22<br>○ | 89.00 |
| Ex. 12 | ○ 97<br>○ | ○ 28<br>○ | ○ 13.20<br>○ | ○ 12.14<br>○ | 93.00 |
| Ex. 13 | ○ 95<br>○ | ○ 31<br>○ | ○ 14.30<br>○ | ○ 12.00<br>○ | 93.00 |
| Ex. 14 | ○ 158<br>○ | ○ 28<br>○ | ○ 12.50<br>○ | ○ 7.50<br>○ | 85.70 |
| C. Ex. 1 | × 300<br>× | — —<br>— | ○ 14.20<br>○ | ○ 13.00<br>○ | 86.70 |
| C. Ex. 2 | × 300<br>× | — —<br>— | ○ 14.40<br>○ | ○ 13.00<br>○ | 86.30 |
| C. Ex. 3 | ○ 100<br>○ | ○ 33<br>○ | ○ 8.55<br>○ | ○ 7.74<br>○ | 85.60 |
| C. Ex. 4 | ○ 150<br>○ | ○ 18<br>○ | ○ 17.00<br>○ | ○ 15.04<br>○ | 87.40 |
| C. Ex. 5 | ○ 140<br>○ | ○ 22<br>○ | ○ 13.20<br>○ | ○ 11.80<br>○ | 83.80 |
| C. Ex. 6 | ○ 84<br>○ | ○ 18<br>○ | ○ 14.23<br>○ | ○ 11.96<br>○ | 84.60 |
| C. Ex. 7 | ○ 117<br>○ | ○ 23<br>○ | ○ 10.80<br>○ | ○ 9.20<br>○ | 85.00 |
| C. Ex. 8 | ○ 122<br>○ | ○ 20<br>○ | ○ 9.80<br>○ | ○ 8.40<br>○ | 85.30 |
| C. Ex. 9 | ○ 190<br>○ | ○ 25<br>○ | ○ 10.20<br>○ | × 5.50<br>× | 85.10 |

TABLE 9

| | $R_{SCI}$ (%) | | $R_{SEC}$ (%) | | $R_{SCE}/R_{SCI}$ (%) | |
|---|---|---|---|---|---|---|
| Ex. 3 | ○ | 63.20 | ○ | 58.60 | ○ | 92.7% |
| Ex. 4 | ○ | 60.1 | ○ | 55.6 | ○ | 92.5% |
| Ex. 5 | ○ | 56.40 | ○ | 51.80 | ○ | 91.8% |
| Ex. 6 | ○ | 50.30 | ○ | 45.80 | ○ | 91.1% |
| Ex. 7 | ○ | 62.00 | ○ | 57.50 | ○ | 92.7% |
| Ex. 8 | ○ | 54.9 | ○ | 50.5 | ○ | 92.0% |
| Ex. 9 | ○ | 56.60 | ○ | 51.90 | ○ | 91.7% |
| Ex. 10 | ○ | 57.70 | ○ | 53.10 | ○ | 92.0% |
| Ex. 11 | ○ | 55.20 | ○ | 50.70 | ○ | 91.8% |
| Ex. 12 | ○ | 53.10 | ○ | 48.30 | ○ | 91.0% |
| Ex. 13 | ○ | 54.20 | ○ | 49.70 | ○ | 91.7% |
| Ex. 14 | ○ | 55.90 | ○ | 50.80 | ○ | 90.9% |
| C. Ex. 1 | × | 39.5 | × | 39.0 | ○ | 98.9% |
| C. Ex. 2 | ○ | 58.6 | ○ | 54.80 | ○ | 93.5% |
| C. Ex. 3 | × | 24.4 | × | 29.1 | ○ | 119.5% |
| C. Ex. 4 | × | 21.0 | × | 14.7 | ○ | 70.2% |
| C. Ex. 5 | × | 19.4 | × | 12.8 | ○ | 65.8% |
| C. Ex. 6 | × | 40.5 | × | 35.9 | ○ | 88.7% |
| C. Ex. 7 | × | 42.9 | × | 38.0 | ○ | 88.6% |
| C. Ex. 8 | × | 47.4 | ○ | 42.5 | ○ | 89.6% |
| C. Ex. 9 | × | 49.1 | ○ | 48.4 | ○ | 98.6% |

Referring to the results in Tables 8 and 9, the multilayer cured films of Examples 3 to 14 each had a high light-shielding property and a high reflectance while maintaining excellent resolution and pattern characteristics.

Specifically, the multilayer cured films of Examples 3 to 14 each had a total thickness of 6 μm to 20 μm, thereby forming a sufficient thickness to be used for quantum dot barrier ribs. If the multilayer cured film having a thickness within the above range is used as quantum dot barrier ribs, when a quantum dot solution is dropped, it would not overflow the barrier ribs. Thus, the compositions of colors are not mixed, and it is possible to prevent deterioration in the resolution.

In addition, the multilayer cured films of Examples 3 to 14 not only showed excellent $R_{SCE}$ and $R_{SCI}$ values, but also had a ratio between them ($R_{SCE}/R_{SCI}$) of up to 92.7%, thereby satisfying high reflectivity characteristics.

Meanwhile, it was confirmed that the reflectance varies depending on the content of $TiO_2$ in the white pigment and the particle sizes of the white pigment and the pigment other than white.

Specifically, the multilayer cured films of Examples 3 and 4 each had a remarkably excellent reflectance as compared with the multilayer cured films of Comparative Examples 1 to 9 and were further enhanced as compared with the multilayer cured films of Examples 5 to 14.

Figure 5:
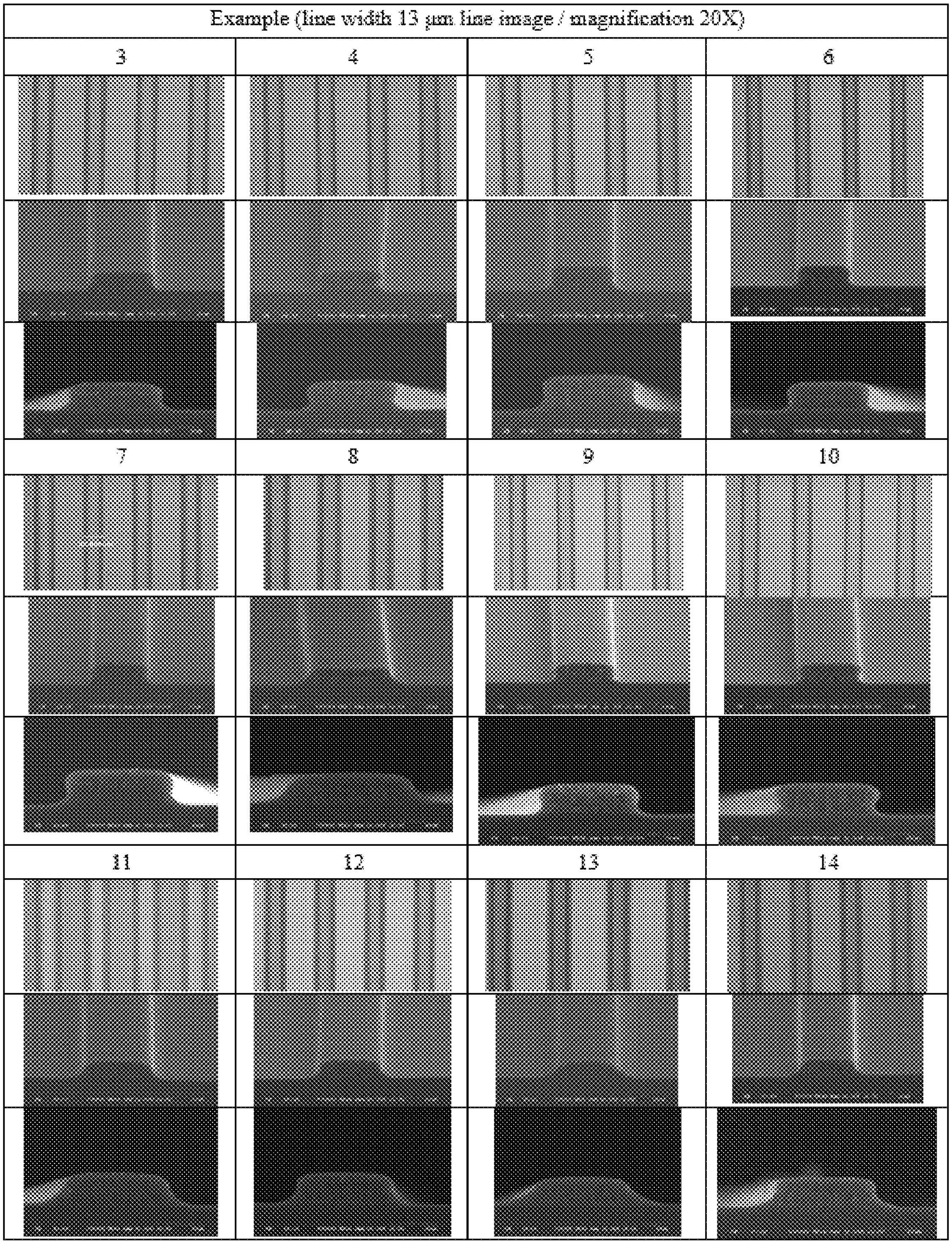
FIG. 5 shows photographs of the cross-section and lateral side of the multilayer cured films of Examples 3 to 14 observed with an optical microscope.

In addition, FIG. 5 shows photographs of the cross-section and lateral side of the multilayer cured films of Examples 3 to 14 observed with an optical microscope. As confirmed from FIG. 5, the multilayer cured films of Examples 3 to 14 were all clear and distinct in line width and color and were uniform and thick in film thickness.

Figure 6:
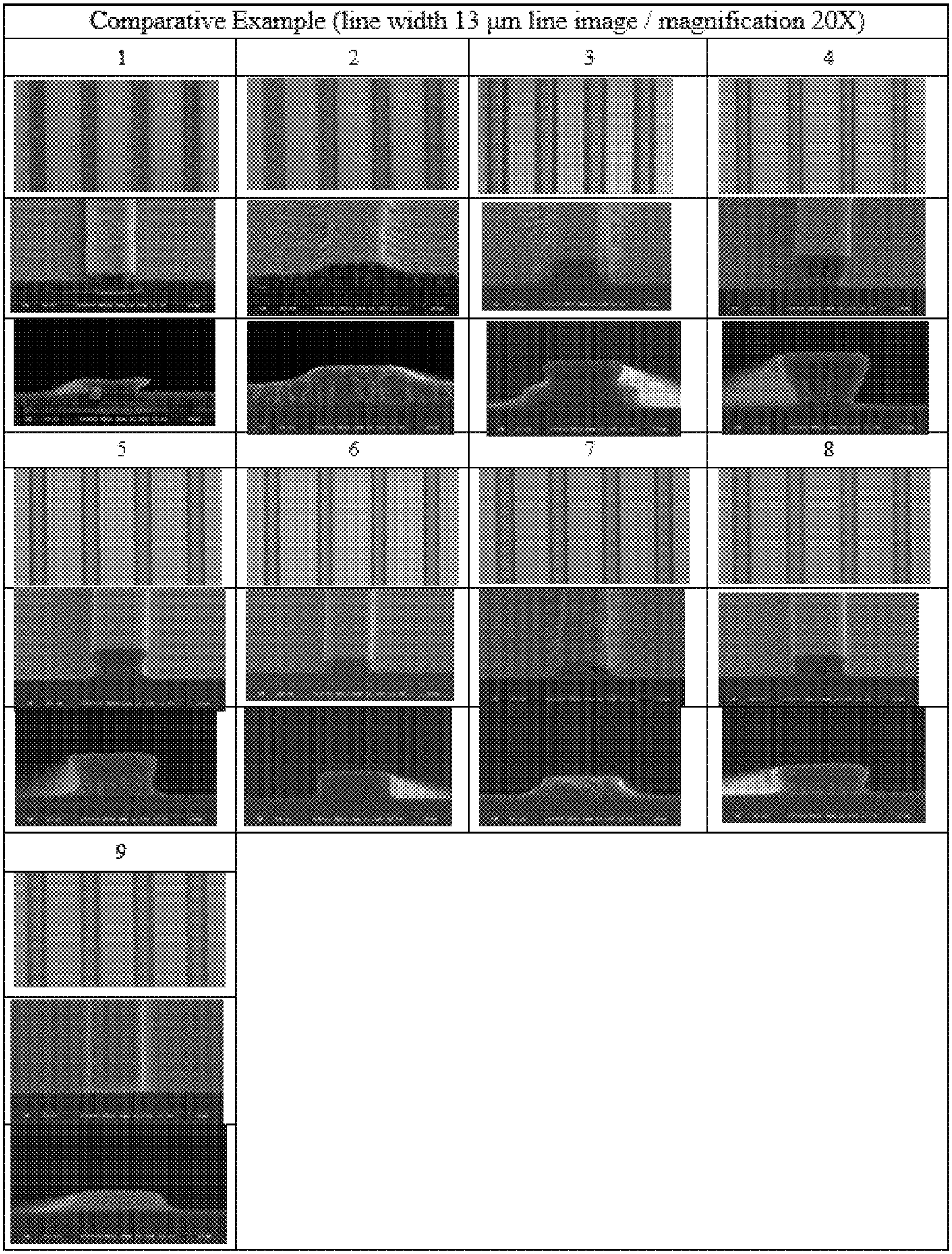
FIG. 6 is photographs of the cross-section and lateral side of the multilayer cured films of Comparative Examples 1 to 9 observed with an optical microscope.

In contrast, as can be seen in FIG. 6, the multilayer cured films of Comparative Examples 1 to 9 were not clear in line width and color as compared with the cured films of Examples 3 to 14, the uniformity of the thickness was poor, or the film thickness was too low to be suitable as a barrier rib.

REFERENCE NUMERALS OF THE DRAWINGS

| [Reference Numerals of the Drawings] |
|---|
| 100: substrate structure |
| 110: transparent substrate |
| 120: barrier rib |
| 130: first quantum dot solution |
| 140: second quantum dot solution |
| 150: third quantum dot solution |
| 200, 300, 400: multilayer cured film |
| 210, 310, 410: substrate |
| 211, 311, 411: first cured film |
| 212, 312, 412, 313, 413, n: second cured film |

The invention claimed is:

1. A multilayer cured film, which comprises a first cured film formed from a first colored photosensitive resin composition and a second cured film formed from a second colored photosensitive resin composition, wherein the first colored photosensitive resin composition comprises (A1) a first copolymer; (B) a photopolymerizable compound; (C) a photopolymerization initiator; and (D1) a white pigment, the second colored photosensitive resin composition comprises (A2) a second copolymer; (B) a photopolymerizable compound; (C) a photopolymerization initiator; and (D2) a pigment other than white, wherein the pigment other than white (D2) is at least one selected from the group consisting of a yellow pigment, a violet pigment, a red pigment, an orange pigment, and a blue pigment, wherein the pigment other than white (D2) is employed in an amount of 5 to 10 parts by weight relative to 100 parts by weight of the second copolymer (A2) (on the basis of the solids content), the multilayer cured film has a total thickness of 6 μm or more, and wherein the reflectance $R_{SCI}$ measured by the SCI (specular component included) method and the reflectance $R_{SCE}$ measured by the SCE (specular component excluded) method for the multilayer cured film satisfy the following relationships, respectively:

$$50\% \leq R_{SCI} \quad \text{(Relationship 1)}$$

$$40\% \leq R_{SCE} \quad \text{(Relationship 2)}$$

$$50\% \leq R_{SCE}/R_{SCI} \quad \text{(Relationship 3).}$$

2. The multilayer cured film of claim 1, wherein the first cured film and the second cured film have a thickness of 10 μm or less, respectively.

3. The multilayer cured film of claim 2, wherein the second cured film is composed of multiple layers.

4. The multilayer cured film of claim 3, wherein the second cured film is composed of 2 to 10 layers.

5. The multilayer cured film of claim 1, wherein the multilayer cured film has a total thickness of 6 μm to 20 μm.

6. The multilayer cured film of claim 1, wherein the multilayer cured film is used as a structure of quantum dot barrier ribs.

* * * * *